(12) United States Patent
Lee et al.

(10) Patent No.: US 12,432,934 B2
(45) Date of Patent: Sep. 30, 2025

(54) SEMICONDUCTOR MEMORY DEVICE

(71) Applicant: SAMSUNG ELECTRONICS CO., LTD., Suwon-si (KR)

(72) Inventors: Yong Jae Lee, Suwon-si (KR); Seul Ji Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 18/104,882

(22) Filed: Feb. 2, 2023

(65) Prior Publication Data

US 2023/0354615 A1 Nov. 2, 2023

(30) Foreign Application Priority Data

May 2, 2022 (KR) ........................ 10-2022-0054096

(51) Int. Cl.
*H10B 63/00* (2023.01)
*H10N 70/00* (2023.01)

(52) U.S. Cl.
CPC ............ *H10B 63/24* (2023.02); *H10B 63/84* (2023.02); *H10N 70/841* (2023.02)

(58) Field of Classification Search
CPC ....... H10B 63/24; H10B 63/84; H10N 70/841
See application file for complete search history.

(56) References Cited

U.S. PATENT DOCUMENTS

| | | |
|---|---|---|
| 6,034,882 A | 3/2000 | Johnson et al. |
| 8,921,817 B2 | 12/2014 | Son |
| 10,096,655 B1 | 10/2018 | Pellizzer et al. |
| 10,366,747 B2 | 7/2019 | Castro |
| 10,381,075 B2 | 8/2019 | Totorelli et al. |
| 10,424,374 B2 | 9/2019 | Redaelli et al. |
| 10,475,995 B2 | 11/2019 | Fantini |
| 10,546,632 B2 | 1/2020 | Redaelli et al. |
| 10,593,399 B2 | 3/2020 | Fratin et al. |
| 10,700,128 B1 | 6/2020 | Fantini et al. |
| 10,833,124 B2 | 11/2020 | Kim et al. |
| 11,200,950 B2 | 12/2021 | Redaelli et al. |
| 2013/0009125 A1 | 1/2013 | Park et al. |
| 2015/0200358 A1 | 7/2015 | Kang et al. |
| 2020/0273910 A1 | 8/2020 | Wu |

*Primary Examiner* — Samuel A Gebremariam
(74) *Attorney, Agent, or Firm* — Muir Patent Law, PLLC

(57) ABSTRACT

A semiconductor memory device includes a substrate, a first electrode on the substrate, a second electrode on the first electrode, an OTS film between the first electrode and the second electrode, and an electrode spacer film disposed on a part of a side wall of the OTS film, wherein the OTS film includes a first surface that is in contact with the first electrode, a second surface that is in contact with the second electrode, and a third surface that is in contact with the electrode spacer film, and a logical state of data stored in the OTS film is based on polarity of a program voltage.

20 Claims, 35 Drawing Sheets

SEMICONDUCTOR MEMORY DEVICE

CROSS-REFERENCE TO RELATED APPLICATION

Korean Patent Application No. 10-2022-0054096, filed on May 2, 2022, in the Korean Intellectual Property Office, and entitled "Semiconductor Memory Device" is incorporated by reference herein in its entirety.

BACKGROUND

1. Field

Embodiments relate to a semiconductor memory device, and more particularly, to a semiconductor memory device in which reliability is improved by making areas of electrodes being in contact with an Ovonic Threshold Switching (OTS) film different.

2. Description of the Related Art

Semiconductor memory devices are widely used to store information in various electronic devices, for example, a computer, a wireless communication device, a camera, a digital display, and the like. Information may be stored by programming different states of the semiconductor memory device. For example, the semiconductor memory device may have two states marked by logical "1" or logical "0". Components of the electronic device may read or sense the stored state in the semiconductor memory device to access the stored information. The components of the electronic device may write or program the state in the semiconductor memory device to store the information.

SUMMARY

Embodiments are directed to a semiconductor memory device, including a substrate, a first electrode on the substrate, a second electrode on the first electrode, an OTS film between the first electrode and the second electrode, and an electrode spacer film disposed on a part of a side wall of the OTS film, wherein the OTS film includes a first surface that is in contact with the first electrode, a second surface that is in contact with the second electrode, and a third surface that is in contact with the electrode spacer film, and a logical state of data stored in the OTS film is based on polarity of a program voltage.

Embodiments are also directed to a semiconductor memory device, including a substrate, a stacked structure having a plurality of first electrodes and a plurality of first insulating films alternately stacked on the substrate, a second electrode that penetrates the stacked structure in a second direction, and a plurality of OTS films provided between each of the first electrodes and the second electrode, wherein the OTS film includes a first surface that is in contact with the first electrode, and a second surface that is in contact with the second electrode, a logical state of data stored in the OTS film is based on polarity of a program voltage, and the second electrode covers a part of the OTS film.

Embodiments are also directed to a semiconductor memory device, including a substrate, a first conductive line extending in a first direction on the substrate, a second conductive line which extends in a second direction intersecting the first direction, on the first conductive line, and a first memory cell provided between the first conductive line and the second conductive line, wherein the first memory cell includes a first electrode connected to the first conductive line, a second electrode connected to the second conductive line, a first OTS film between the first electrode and the second electrode, and a first electrode spacer film that wraps at least two side walls of the first OTS film, on a part of the side walls of the first OTS film, wherein the first OTS film includes a first surface that is in contact with the first electrode, a second surface that is in contact with the second electrode, and a third surface that is in contact with the first electrode spacer film, the first electrode spacer film includes the same material as the first electrode, and a logical state of data stored in the first OTS film is based on polarity of a program voltage.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
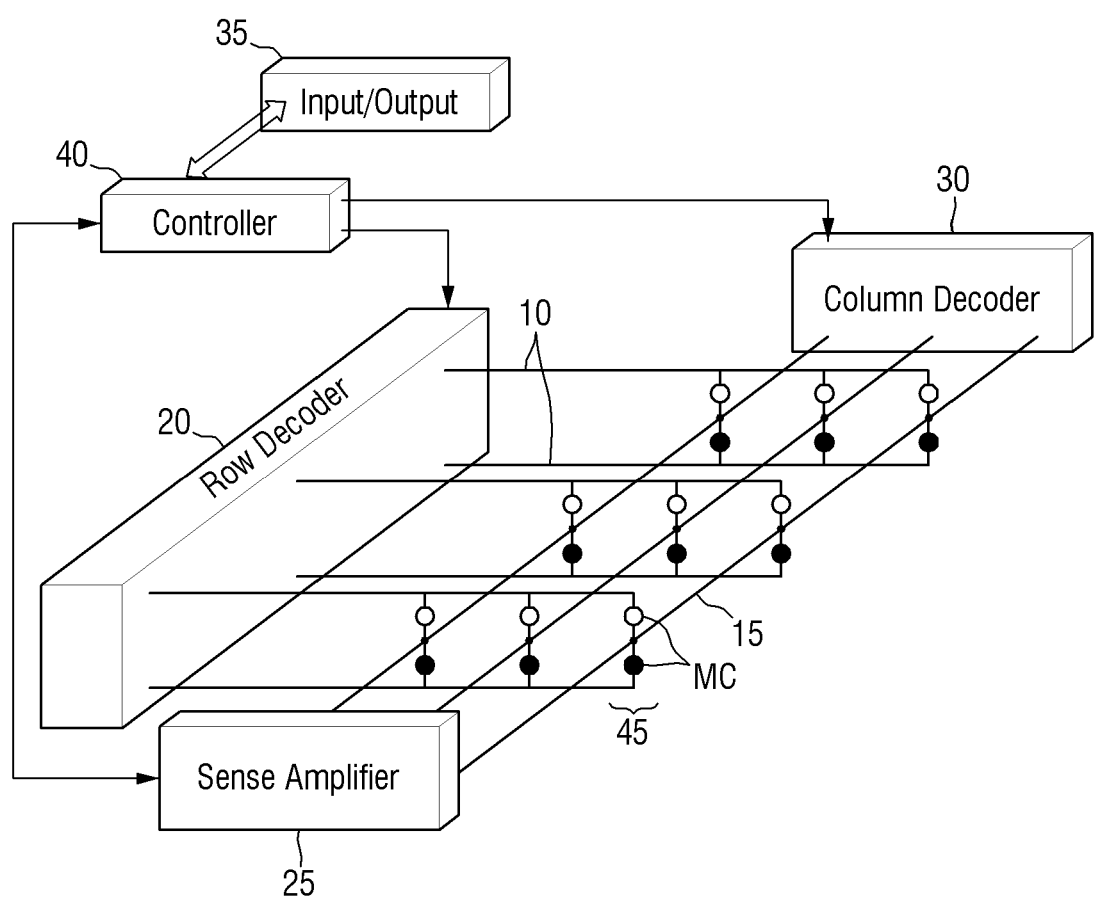
FIG. 1 is a diagram for explaining an operating method of a semiconductor memory device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, an operating method of a semiconductor memory device according to some example embodiments will be described referring to FIGS. 1 and 2.

FIG. 1 is a diagram for explaining an operating method of a semiconductor memory device according to an example embodiment. FIG. 2 is a diagram for explaining the operating method of a semiconductor memory device according to another example embodiment.

First, referring to FIG. 1, the semiconductor memory device according to an example embodiment may include at least one or more memory cells MC. Each memory cell MC may be programmable to store two states marked by logical "0" and logical "1". In some example embodiments, the memory cell MC may store two excessive logical states.

The memory cell MC may include an information storage element indicating a logical state. The information storage element may include a chalcogenide material. The chalcogenide material may have a variable threshold voltage or a variable resistance. The chalcogenide material may include a compound in which at least one of S, Te and Se as a chalcogen element is combined with at least one of Ge, Sb, Bi, Al, Tl, Sn, Zn, As, Si, In, Ti, Ga and P.

In some example embodiments, the threshold voltage of the memory cell MC may be variable depending on a polarity used to program the memory cell MC. For example, a self-selecting memory cell programmed with one polarity may have one threshold voltage depending on a particular resistance, and may be programmed with different polarities that may generate different threshold voltages from each other depending on the different resistance characteristics of the self-selecting memory cell. When a self-selecting memory cell is programmed, ions in the chalcogenide material may move. Ions may move toward a particular electrode depending on the polarity of a predetermined cell. For example, in the self-selecting memory cell, ions may move toward negative electrodes. The self-selecting memory cell is then read by applying a voltage to the self-selecting memory cell and may detect toward which electrode the ions have moved.

The memory array of the semiconductor memory device according to some example embodiments may be configured two-dimensionally (2D) or may be configured three-dimensionally (3D). The three-dimensional (3D) memory array may have a structure in which memory cells MC are vertically stacked. The three-dimensional memory array may increase the number of memory cells MC that may be formed on one substrate as compared with the two-dimensional memory array. The memory array shown in FIG. 1 may be a three-dimensional memory array in which the memory cell MC may include two layers. However, the technical idea of the present disclosure is not limited thereto. The memory cell MC may be aligned across each layer. The memory cells MC may form a memory cell stack 45.

Each row and column of the memory cell MC may be connected to a first conductive line 10 and a second conductive line 15. Although the first conductive line 10 may be a word line, and the second conductive line 15 may be a bit line, the present disclosure is not limited thereto. The first conductive line 10 and the second conductive line 15 may extend substantially perpendicular to each other.

In some example embodiments, one memory cell MC may be placed at an intersection between the first conductive line 10 and the second conductive line 15. The intersection may be referred to as an address of the memory cell MC. A target memory cell MC may be located at the intersection between the word line and the bit line to which the voltage is applied. That is, the first conductive line 10 and the second conductive line 15 may function to read and write the memory cell MC at the intersections.

In some example embodiments, reading and writing may include applying of voltage or current to each conductive line. By activating or selecting the first conductive line 10 and the second conductive line 15, reading and writing may be performed on the memory cell MC. The first conductive line 10 and the second conductive line 15 may include a conductive material, and may include, for example, metal materials such as copper (Cu), aluminum (Al), gold (Au), tungsten (W), and titanium (Ti), metal alloys, carbon, conductively doped semiconductor materials, and/or other conductive material. When the memory cell MC is selected, it may be affected, for example, to set the logical state of the memory cell MC, which is a mobility of selenium (Se) ions.

For example, the memory cell MC may be programmed by applying an electrical pulse to a chalcogenide material including selenium (Se). The pulse may be provided, for example, through the first conductive line 10 or the second conductive line 15. When the pulse is provided, the selenium (Se) ion may move inside the information storage element according to the polarity of the memory cell MC. Therefore, the concentration of selenium (Se) on the surface of the information storage element may be affected by the polarity of the voltage between the first conductive line 10 and the second conductive line 15.

A voltage may be applied to the memory cell MC to read the memory cell MC. A threshold voltage at the time when the current generated through the application of the voltage starts to flow may represent the state of logical "1" or logical "0". The difference in concentration of selenium (Se) ions at the end of the information storage element may affect the threshold voltage. The difference in concentration of selenium (Se) ions at the end of the information storate element may generate a greater difference in cell response between the logical states.

Access to the memory cell MC may be controlled through a row decoder 20 and a column decoder 30. For example, the row decoder 20 may receive a row address from a controller 40. Further, the row decoder 20 may activate an appropriate first conductive line 10 on the basis of the row address received from the controller 40. Similarly, the column decoder 30 may receive a column address from the controller 40. Further, the column decoder 30 may activate a second conductive line 15 on the basis of the column address received from the controller 40. The memory cell MC may be accessed by activating the first conductive line 10 and the second conductive line 15.

When accessing the memory cell MC, the memory cell MC may be read or sensed by a sense amplifier 25. For example, the sense amplifier 25 may determine the logical state stored in the memory cell MC on the basis of a signal generated by accessing the memory cell MC. The generated signal may include voltage or current. Therefore, the sense amplifier 25 may include a voltage sense amplifier, a current sense amplifier, or both.

For example, a voltage may be applied to the memory cell MC. The magnitude of the current generated by the applied voltage may depend on the resistance of the memory cell MC. Similarly, a current may be applied to the memory cell MC. The magnitude of the voltage for generating the current may depend on the resistance of the memory cell MC. The sense amplifier 25 may include various transistors or amplifiers for detecting and amplifying signals. This may be called latching. Next, the detected logical state of the memory cell MC may be output through an input/output device. In an example embodiment, the sense amplifier 25 may be a part of the column decoder 30 or the row decoder 20. Alternatively, the sense amplifier 25 may be connected to or communicate with the column decoder 30 or the row decoder 20.

The memory cell MC may be programmed or written by activating the first conductive line 10 and the second conductive line 15. The logical value may be stored in the memory cell MC. The column decoder 30 or the row decoder 20 may receive data to be written to the memory cell MC, for example, input/output 35. In the case of a phase change memory or a self-selecting memory, the memory cell MC may written, by heating the information storage element, for example, by making a current pass through the memory storage element. The selenium (Se) ions may be concentrated in a specific electrode, depending on the logical state written in the memory cell MC, for example, the logical "1" or the logical "0".

For example, the selenium (Se) ions concentrated in in a first electrode according to the polarity of the memory cell MC may generate a first threshold voltage indicating a state of logical "1". The selenium (Se) ions concentrated in a second electrode may generate a second threshold voltage indicating a state of logical "0". The first threshold voltage and the second threshold voltage may be different from each other. The larger the difference between the first threshold voltage and the second threshold voltage is, the more reliable the semiconductor memory device may be.

The controller 40 may control the operations (reading, writing, rewriting, refresh, discharge, etc.) of the memory cell MC through various components, for example, the row decoder 20, the column decoder 30, and the sense amplifier 25. In some example embodiments, one or more of the row decoder 20, the column decoder 30, and the sense amplifier 25 may be placed together with the controller 40. The controller 40 may generate row and column address signals to activate the desired first conductive line 10 and second conductive line 15. The controller 40 may also generate and control various voltages or currents used during the operation of the memory array. For example, the controller 40 may apply a discharge voltage to the first conductive line 10 or the second conductive line 15 after accessing one or more memory cells MC.

Figure 2:
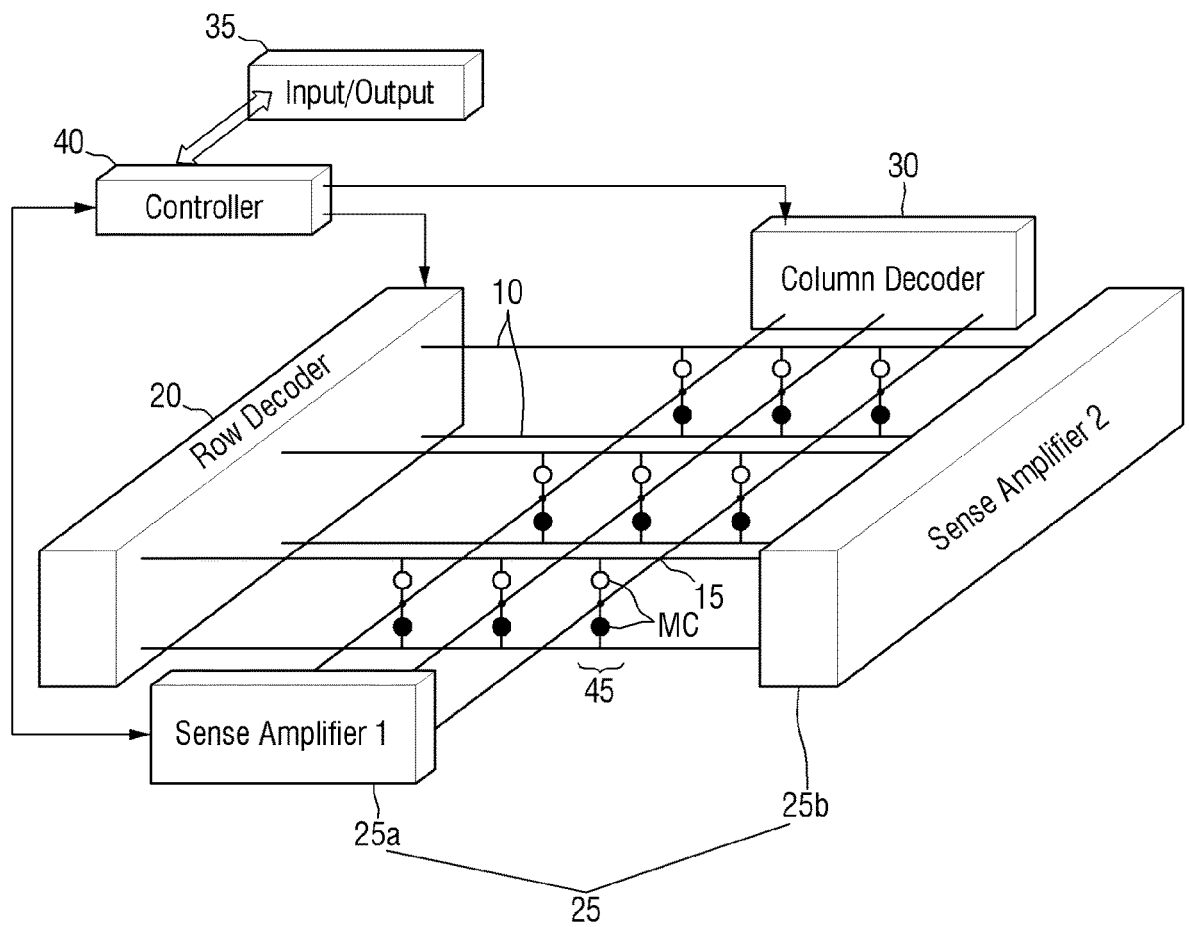
FIG. 2 is a diagram for explaining the operating method of a semiconductor memory device according to another example embodiment.

Referring to FIG. 2, the sense amplifier 25 may include a first sense amplifier 25a and a second sense amplifier 25b.

The first sense amplifier 25a may be connected to the second conductive line 15. The second sense amplifier 25b may be connected to the first conductive line 10. Since the first sense amplifier 25a and the second sense amplifier 25b are provided, in the semiconductor memory device according to some example embodiments, the first conductive line 10 may function as a word line or as a bit line. Similarly, the second conductive line 15 may function as a word line or as a bit line.

The memory cell MC of the semiconductor memory device according to some example embodiments may have an asymmetric structure. When the memory cell MC has an asymmetric structure and the memory cells MC are stacked three-dimensionally (3D), a semiconductor memory device having improved reliability by controlling the operations of the first and second sense amplifiers 25a and 25b may be fabricated.

Hereinafter, the semiconductor memory device according to some example embodiments will be described referring to FIGS. 3 to 14.

Although the drawings show that the semiconductor memory device according to some example embodiments is a self-selecting memory, the technical idea of the present disclosure is not limited thereto.

Figure 3:
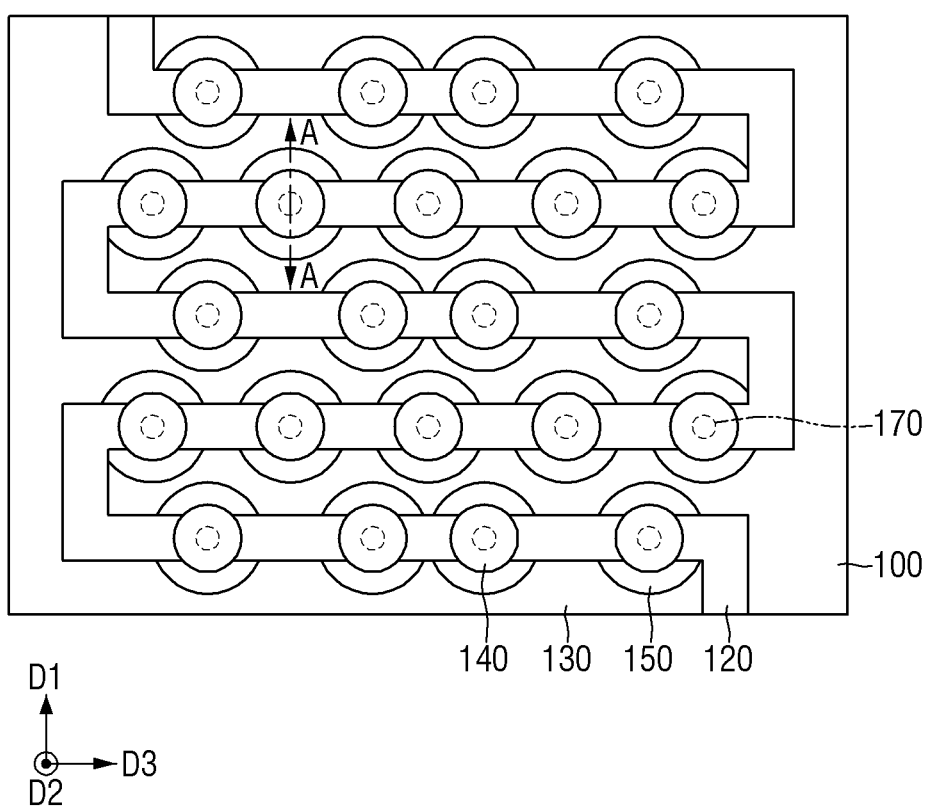
FIG. 3 is an exemplary plan view of a semiconductor memory device according to some example embodiments.
Figure 4:
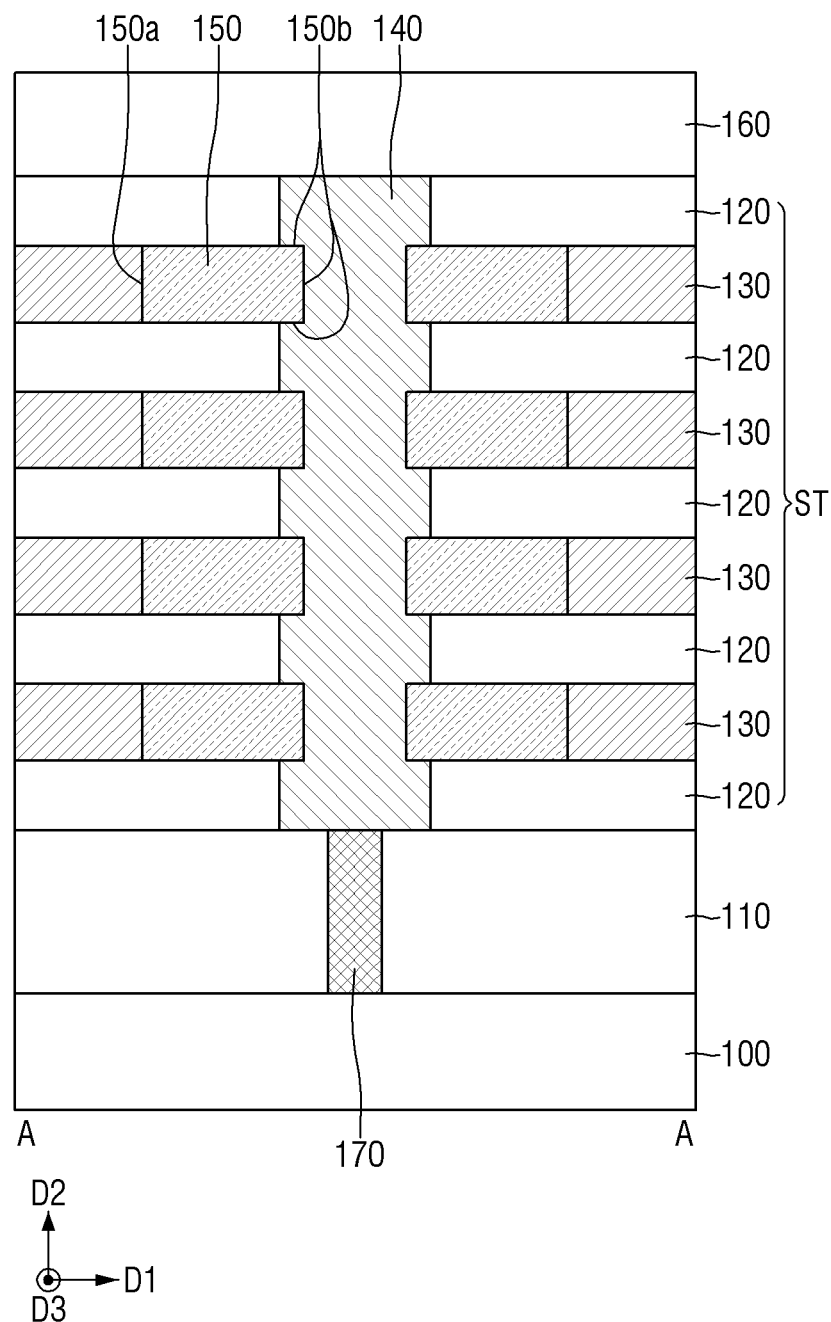
FIG. 4 is a cross-sectional view taken along a line A-A of FIG. 3.

FIG. 3 is an exemplary plan view of a semiconductor memory device according to some example embodiments. FIG. 4 is a cross-sectional view taken along a line A-A of FIG. 3.

Referring to FIGS. 3 and 4, semiconductor memory device according to some embodiments may include a substrate 100, a first interlayer insulating film 110, a stacked structure ST, a second electrode 140, an OTS film 150, a via contact 170, and a second interlayer insulating film 160.

The substrate 100 may be a semiconductor substrate. For example, the substrate 100 may be bulk silicon or silicon-on-insulator (SOI). The substrate 100 may be a silicon substrate or may include other materials, for example, silicon germanium, indium antimonide, lead tellurium compounds, indium arsenic, indium phosphide, gallium arsenide or gallium antimonide. Alternatively, the substrate 100 may have an epi-layer formed on a base substrate.

The first interlayer insulating film 110 may be provided on the substrate 100. The first interlayer insulating film 110 may include an insulating material of oxide series. For example, the first interlayer insulating film 110 may include, but not limited to, at least one of a silicon oxide, a silicon oxynitride, and a low-k material having a lower dielectric constant than silicon oxide.

The stacked structure ST may be provided on the first interlayer insulating film 110. The stacked structure ST may include a plurality of first insulating films 120 and a plurality of first electrodes 130. Each first insulating film 120 and each first electrode 130 may be alternately stacked in the second direction D2. As used herein, the first direction D1, the second direction D2, and the third direction D3 may be substantially perpendicular to each other. The second direction D2 may be a direction perpendicular to an upper side of the substrate 100, or may be a thickness direction of the stacked structure ST.

The first electrode 130 may be provided between the first insulating films 120, and the first insulating film 120 may be provided between the first electrodes 130. The respective first electrodes 130 may be electrically insulated from each other by the first insulating film 120. In some example embodiments, the first electrode 130 may be connected to the word line of the semiconductor memory device, but is not limited thereto.

The first electrode 130 may include a conductive material. As an example, the first electrode 130 may include carbon (C). On the other hand, the first electrode 130 may include at least one of a metal such as tungsten (W), platinum (Pt), palladium (Pd), rhodium (Rh), ruthenium (Ru), iridium (Ir), copper (Cu), aluminum (Al), titanium (Ti) and tantalum (Ta), a metal nitride such as titanium nitride (TiN), and combinations thereof.

The first insulating film 120 may include an insulating material of oxide series. As an example, the first insulating film 120 may include, but not limited to, a silicon oxide.

The second electrode 140 may penetrate the stacked structure ST. The second electrode 140 may penetrate the stacked structure ST in the second direction D2 and be connected to the via contact 170. The via contact 170 may be connected to the bit line of the semiconductor memory device according to some example embodiments. That is, the second electrode 140 may be electrically connected to the bit line of the semiconductor memory device according to some example embodiments.

The via contact 170 may be provided inside the first interlayer insulating film 110. The via contact 170 may be formed inside the first interlayer insulating film 110 and be connected to the second electrode 140.

The second electrode 140 may include a conductive material. As an example, the second electrode 140 may include carbon (C). On the other hand, the second electrode 140 may include at least one of a metal such as tungsten (W), platinum (Pt), palladium (Pd), rhodium (Rh), ruthenium (Ru), iridium (Ir), copper (Cu), aluminum (Al), titanium (Ti) and tantalum (Ta), a metal nitride such as titanium nitride (TiN), and combinations thereof.

The via contact 170 may include a conductive material. For example, the via contact 170 may include, but not limited to, copper (Cu), aluminum (Al) or tungsten (W).

The OTS film 150 may be provided between the first electrode 130 and the second electrode 140. The first electrode 130, the OTS film 150, and the second electrode 140 may be aligned in the first direction D1. The OTS film 150 may function as an information storage element of the semiconductor memory device according to some example embodiments. The OTS film 150 may include chalcogenide material. The chalcogenide material may include a compound in which at least one of elements S, Te and Se as chalcogen element is combined with at least one of Ge, Sb, Bi, Al, Tl, Sn, Zn, As, Si, In, Ti, Ga and P.

As an example, the OTS film 150 may include at least one of GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeالسTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlS.

The semiconductor memory device according to some example embodiments may store data through mobility of ions included in the OTS film 150. For example, when a voltage is applied to the first electrode 130 and the second electrode 140, the ions included in the OTS film 150 may move to the first electrode 130 or the second electrode 140. As an example, the OTS film 150 may include selenium (Se) ions. When a voltage is applied to the first electrode 130 and the second electrode 140, selenium (Se) ions in the OTS film 150 may move.

The selenium (Se) ions concentrated in the first electrode 130 according to the polarity of the OTS film 150 may generate a first threshold voltage indicating a state of logical "1". The selenium (Se) ions concentrated in the second electrode 140 may generate a second threshold voltage indicating a state of logical "0". The first threshold voltage and the second threshold voltage may be different from each other. The larger the difference between the first threshold voltage and the second threshold voltage is, the more reliable the semiconductor memory device may be. That is, the logical state of the data stored in the OTS film 150 may be based on the concentration of ions on the surface of the OTS film 150. Further, the logical state of the data stored in the OTS film 150 may be based on the polarity of the program voltage.

In some example embodiments, the OTS film 150 may include a first surface 150a that is in contact with the first electrode 130, and a second surface 150b that is in contact with the second electrode 140. The area of the first surface 150a may be different from the area of the second surface 150b. As an example, the area of the first surface 150a may be smaller than the area of the second surface 150b.

When a voltage is applied to the first electrode 130 and the second electrode 140, selenium (Se) ions in the OTS film 150 may move to the first surface 150a or the second surface 150b. The logical state of the data stored in the OTS film 150 may be based on the concentration of selenium (Se) ions on the first surface 150a and the second surface 150b. For example, when the concentration of the first surface 150a is higher than the concentration of the second surface 150b, the OTS film 150 may be in the state of logical "1". When the concentration of the second surface 150b is higher than the concentration of the first surface 150a, the OTS film 150 may be in the state of logical "0".

In some example embodiments, the greater the difference between the concentration of selenium (Se) ions on the first surface 150a and the concentration of selenium (Se) ions on the second surface 150b is, the better the reliability may be. The OTS film 150 of the semiconductor memory device according to some example embodiments may include a first surface 150a and a second surface 150b having different areas from each other. A semiconductor memory device having improved reliability may be improved accordingly.

In some example embodiments, at least a part of the OTS film 150 may overlap the second electrode 140 in the second direction D2. The OTS film 150 may protrude toward the second electrode 140. The second electrode 140 may wrap a part of the OTS film 150. For example, in FIG. 4, the OTS film 150 comes into contact with the first electrode 130 through the first surface 150a. The OTS film 150 comes into contact with the second electrode 140 through the second surface 150b. From the viewpoint of the cross section, one of the four cross sections of the OTS film 150 comes into contact with the first electrode 130. On the other hand, from the viewpoint of the cross section, three cross sections among the four cross sections of the OTS film 150 come into contact with the second electrode 140. Therefore, the area of the first surface 150a being in contact with the first electrode 130 may be smaller than the area of the second surface 150b being in contact with the second electrode 140.

The second interlayer insulating film 160 may be provided on the stacked structure ST. The second interlayer insulating film 160 may cover the stacked structure ST. The second interlayer insulating film 160 may include an insulating material of oxide series. For example, the second interlayer insulating film 160 may include, but not limited to, at least one of a silicon oxide, a silicon oxynitride, and a low dielectric constant (low-k) material having a smaller dielectric constant than silicon oxide.

FIGS. 5 to 14 are exemplary diagrams for explaining a semiconductor memory device according to some example embodiments. For reference, FIGS. 5 to 14 may be exemplary cross-sectional views taken along a line A-A of FIG. 3.

Figure 5:
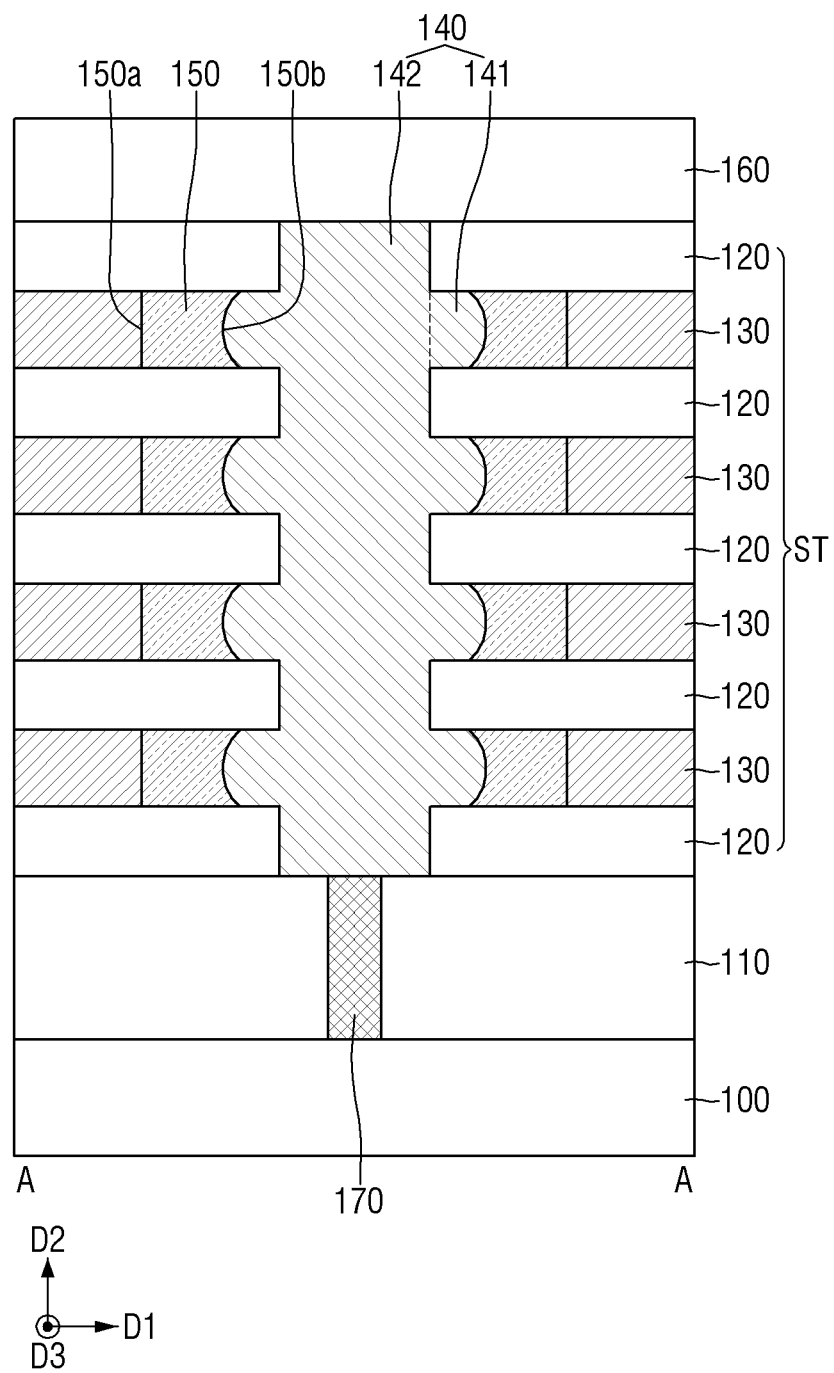
FIGS. 5 to 14 are exemplary diagrams for explaining a semiconductor memory device according to some example embodiments.

First, referring to FIG. 5, the second electrode 140 may include a first portion 141 and a second portion 142. The second portion 142 may extend in the second direction D2. The first portion 141 may protrude from the second portion 142 toward the first electrode 130 in the first direction D1. The first portion 141 overlaps the first insulating film 120 in the second direction D2. The second portion 142 does not overlap the first insulating film 120 in the second direction D2.

The OTS film 150 comes into contact with the first portion 141 of the second electrode 140. The second surface 150b of the OTS film 150 may be a surface that comes into contact with the first portion 141 of the second electrode 140. In some example embodiments, the second surface 150b may be a curved line from the viewpoint of the cross section. The second surface 150b may be convex toward the first electrode 130. The second surface 150b may be concave toward the second electrode 140. That is, the width of the first portion 141 of the second electrode 140 in the first direction D1 may gradually increase and then decrease, as it goes away from the substrate 100. The width of the OTS film 150 in the first direction D1 may gradually decrease and then increase as it goes away from the substrate 100. The first surface 150a may extend in a direction perpendicular to the upper side of the substrate 100. The first surface 150a may extend in the second direction D2.

In some example embodiments, the area of the first surface 150a may differ from the area of the second surface 150b. In an example embodiment, the area of the first surface 150a may be smaller than the area of the second surface 150b. As a result, a highly reliable semiconductor memory device may be fabricated.

Figure 6:
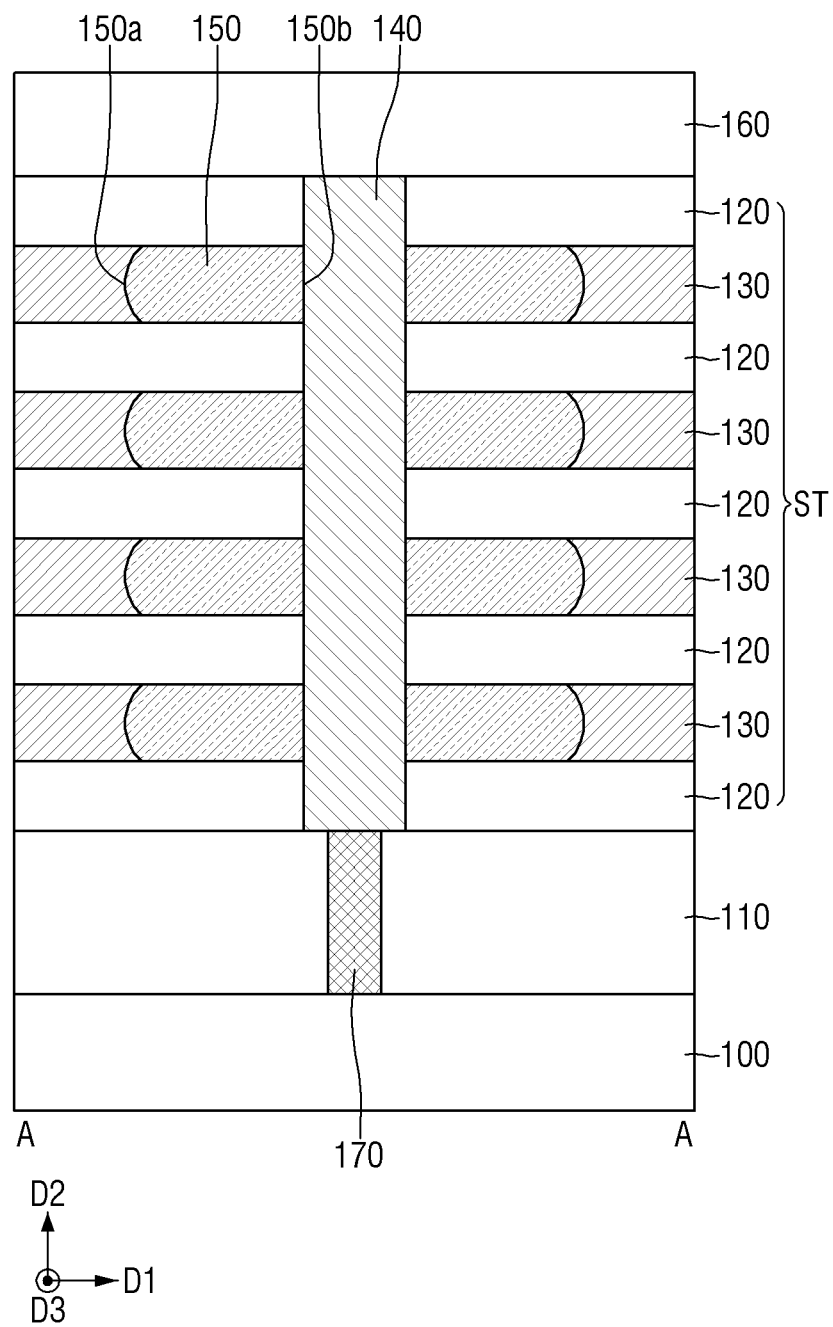

Referring to FIG. 6, the first surface 150a may be a curved line from the viewpoint of the cross section. The first surface 150a may be convex toward the first electrode 130. The first surface 150a may be concave toward the second electrode 140.

The width of the OTS film 150 in the first direction D1 may gradually increase and then decrease, as it goes away from the substrate 100. The second surface 150b may be a straight line from the viewpoint of the cross section. The second surface 150b may extend in the second direction D2.

In some example embodiments, the area of the first surface 150a may differ from the area of the second surface 150b. In an example embodiment, the area of the first surface 150a may be greater than the area of the second surface 150b. As a result, a highly reliable semiconductor memory device may be fabricated.

Figure 7:
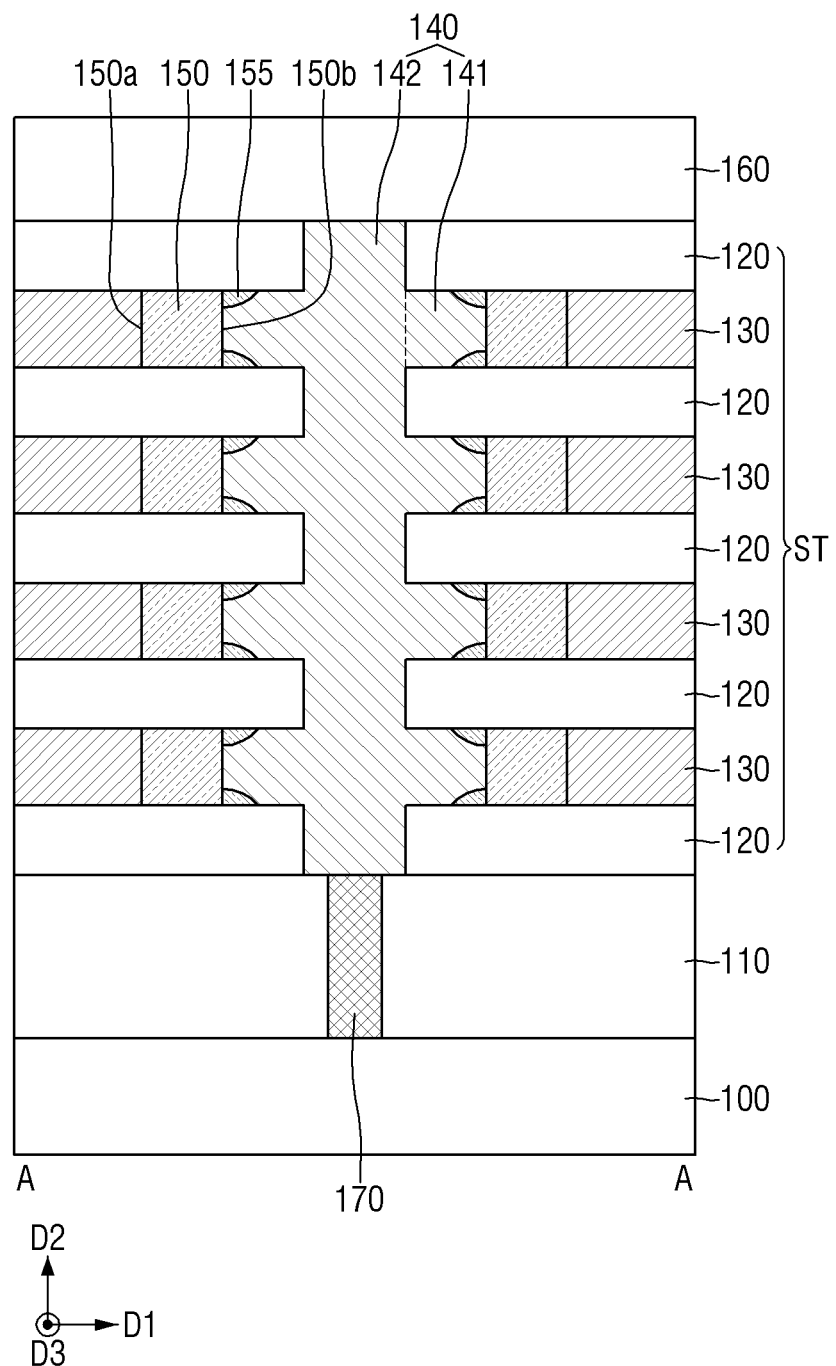

Referring to FIG. 7, the semiconductor memory device according to some example embodiments may further include an OTS spacer film 155.

The OTS spacer film 155 may protrude from the second surface 150b of the OTS film 150 toward the second electrode 140 in the first direction D1. The OTS spacer film 155 may extend in the first direction D1 along one surface of the first insulating film 120. The OTS spacer film 155 may include the same material as the OTS film 150. For example, the OTS spacer film 155 may include a chalcogenide material. The chalcogenide material may include a compound in which at least one of S, Te and Se as the chalcogen elements is combined with at least one of Ge, Sb, Bi, Al, Tl, Sn, Zn, As, Si, In, Ti, Ga and P.

As an example, the OTS spacer film 155 may include at least one of GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeالسTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

Since the OTS spacer film 155 includes the same material as the OTS film 150, the OTS spacer film 155 may also function as an information storage element of the semiconductor memory device according to some example embodiments.

In some example embodiments, the second electrode 140 may include a first portion 141 and a second portion 142. The second portion 142 may extend in the second direction D2. The first portion 141 may protrude from the second portion 142 toward the first electrode 130 in the first direction D1. The first portion 141 overlaps the first insulating film 120 in the second direction D2. The second portion 142 does not overlap the first insulating film 120 in the second direction D2.

The first portion 141 of the second electrode 140 may come into contact with the OTS film 150 and the OTS spacer film 155. Since the OTS spacer film 155 is further included, the area of the chalcogenide material that is in contact with the second electrode 140 may increase. That is, the area of the first surface 150a may be smaller than the sum of the area of the second surface 150b and the area of the surface on which the OTS spacer film 155 and the second electrode come into contact with each other. As a result, a highly reliable semiconductor memory device may be fabricated.

In some example embodiments, at the portion in which the OTS film 150 and the second electrode 140 come into contact with each other, the width of the OTS film 150 in the second direction D2 may be different from the width of the second electrode 140 in the second direction D2. In some example embodiments, at the portion in which the OTS film 150 and the second electrode 140 come into contact with each other, the width of the OTS film 150 in the second direction D2 may be larger than the width of the second electrode 140 in the second direction D2.

Figure 8:
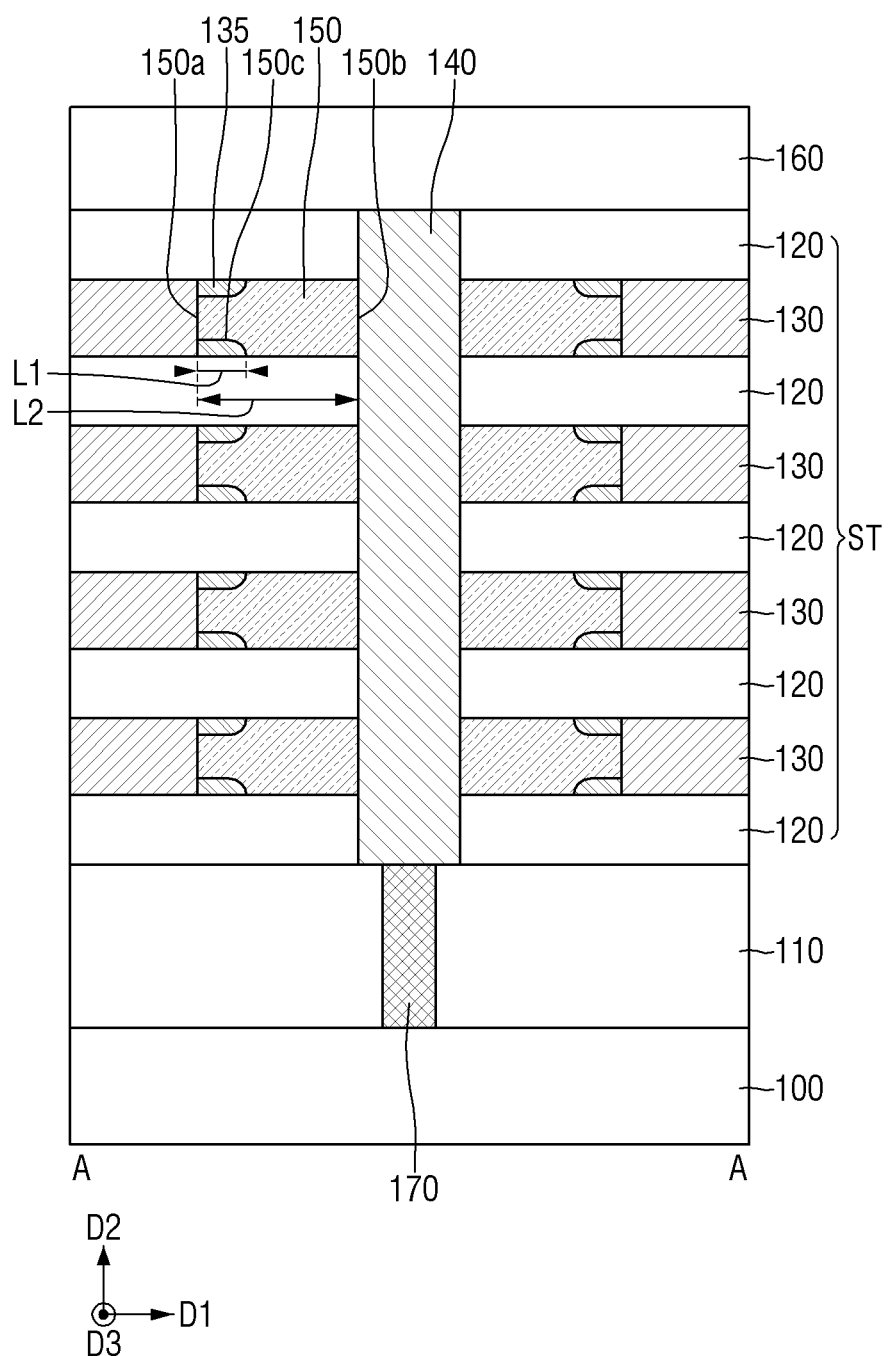

Referring to FIG. 8, the semiconductor memory device according to some example embodiments may further include an electrode spacer film 135.

The electrode spacer film 135 may protrude from the first surface 150a of the OTS film 150 toward the second electrode 140 in the first direction D1. The electrode spacer film 135 may extend in the first direction D1 along one surface of the first insulating film 120. The electrode spacer film 135 may include the same material as the first electrode 130.

The electrode spacer film 135 may include a conductive material. In an example embodiment, the electrode spacer film 135 may include carbon (C). On the other hand, the electrode spacer film 135 may include at least one of a metal such as tungsten (W), platinum (Pt), palladium (Pd), rhodium (Rh), ruthenium (Ru), iridium (Ir), copper (Cu), aluminum (Al), titanium (Ti), and tantalum (Ta), a metal nitride such as titanium nitride (TiN), and combinations thereof.

The electrode spacer film 135 may cover at least a part of the side wall of the OTS film 150. The electrode spacer film 135 may cover at least two or more side walls of the OTS film 150. Further, the electrode spacer film 135 may be provided on a part of the side wall of the OTS film 150. The electrode spacer film 135 does not completely cover the side wall of the OTS film 150. For example, a first length L1 of the electrode spacer film 135 in the first direction D1 is smaller than a second length L2 of the OTS film 150 in the first direction D1. In an example embodiment, a ratio of the first length L1 to the second length L2 may be, but not limited to, about 0.1 to 0.35.

In some example embodiments, since the electrode spacer film 135 includes the same material as the first electrode 130, the electrode spacer film 135 may perform the same function as that of the first electrode 130. By further including the electrode spacer film 135, the area of contact between the OTS film 150 and the first electrode 130 may increase. For example, the OTS film 150 may include a third surface 150c that comes into contact with the electrode spacer film 135. That is, the logical state of the data stored in the OTS film 150 may be based on the concentration of selenium (Se) ions on the third surface 150c.

Therefore, the sum of the area of the portion in which the first electrode 130 and the OTS film 150 come into contact with each other and the area of the portion in which the electrode spacer film 135 and the OTS film 150 come into contact with each other, for example, the sum of the area of the first surface 150a and the area of the third surface 150c may be different from the area of the portion in which the second electrode 140 and the OTS film 150 come into contact with each other, for example, the area of the second surface 150b. A semiconductor memory device with improved reliability can be fabricated accordingly.

In some example embodiments, at the portion in which the OTS film 150 and the first electrode 130 come into contact with each other, the width of the OTS film 150 in the second direction D2 may be different from the width of the first electrode 130 in the second direction D2. In some example embodiments, at the portion in which the OTS film 150 and the first electrode 130 come into contact with each other, the width of the OTS film 150 in the second direction D2 may be larger than the width of the first electrode 130 in the second direction D2.

Figure 9:
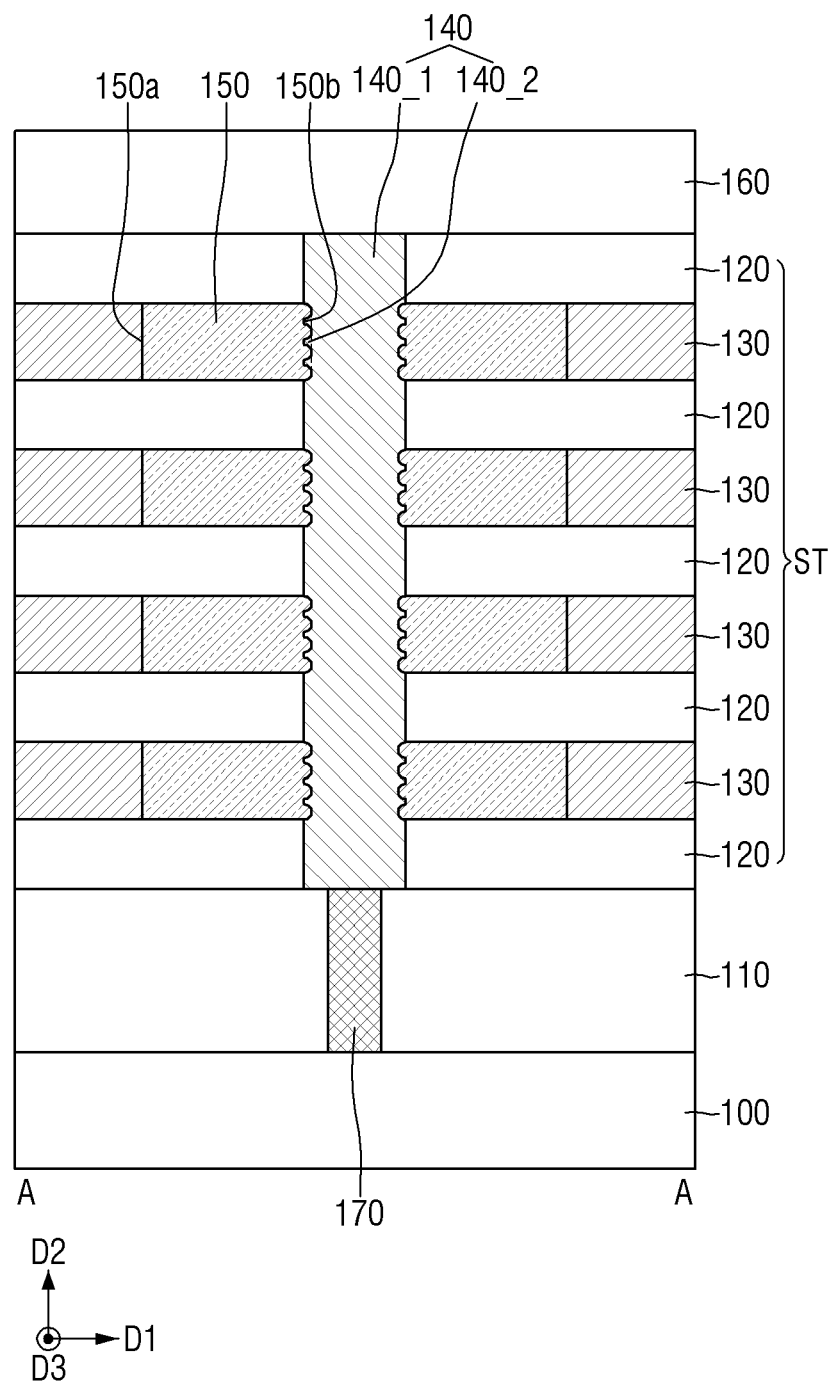

Referring to FIG. 9, the second electrode 140 may include at least three or more protrusions 140_2.

The second electrode 140 may include a body 140_1 and a protrusion 140_2. The body 140_1 may extend in the second direction D2. The protrusion 140_2 may protrude from the body 140_1 toward the first electrode 130 in the first direction D1. Since the second electrode 140 includes the protrusion 140_2, the area of the portion in which the second electrode 140 and the OTS film 150 come into contact with each other may increase. For example, the area of the first surface 150a on which the first electrode 130 not including the protrusion comes into contact with the OTS film 150 may differ from the area of the second surface 150b on which the second electrode 140 including the protrusion 140_2 comes into contact with the OTS film 150. The area of the first surface 150a on which the first electrode 130 comes into contact with the OTS film 150 is smaller than the area of the second surface 150b on which the second electrode 140 including the protrusion 140_2 comes into contact with the OTS film 150. A semiconductor memory device with improved reliability can be fabricated accordingly.

In some example embodiments, the ratio of the length of the second electrode 140 in the first direction D1 to the length of the OTS film 150 in the first direction D1 may be, but not limited to, about 0.05 or more and 0.1 or less.

Figure 10:
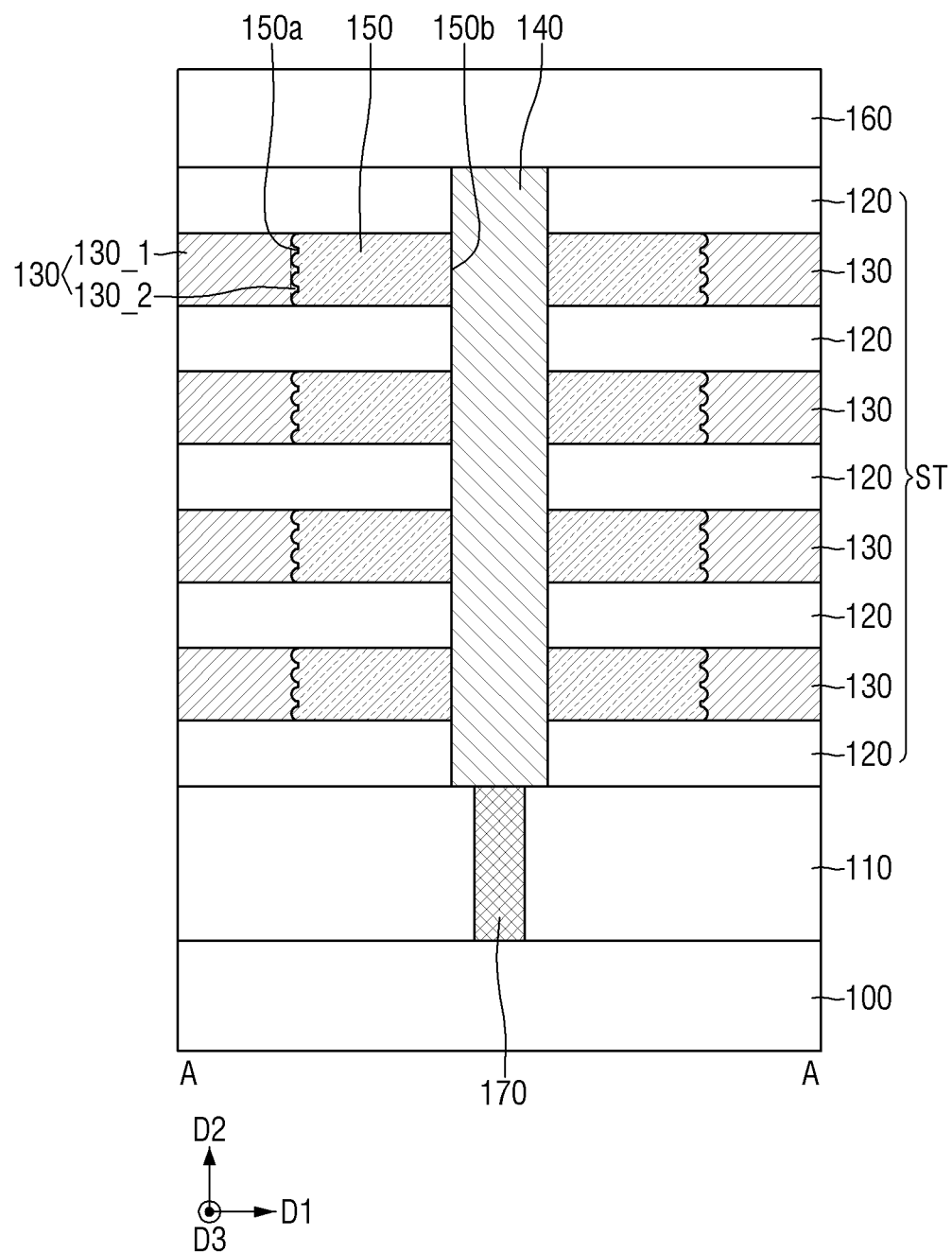

Referring to FIG. 10, the first electrode 130 may include at least three or more protrusions 130_2.

The first electrode 130 may include a body 130_1 and a protrusion 130_2. The protrusion 130_2 of the first electrode 130 may protrude from the body 130_1 toward the second electrode 140 in the first direction D1. The protrusion 130_2 may come into contact with the OTS film 150. Since the first electrode 130 includes the protrusion 130_2, the area of the portion in which the first electrode 130 and the OTS film 150 come into contact with each other may increase. For example, the area of the second surface 150b on which the second electrode 140 and the OTS film 150 come into contact with each other may be different from the area of the first surface 150a on which the first electrode 130 including the protrusion 130_2 and the OTS film 150 come into contact with each other. The area of the first surface 150a is larger than the area of the second surface 150b. A semiconductor memory device with improved reliability can be fabricated accordingly.

In some example embodiments, the ratio of the length of the protrusion 130_2 of the first electrode 130 in the first direction D1 to the length of the OTS film 150 in the first direction D1 may be, but not limited to, about 0.05 or more and 0.1 or less.

Figure 11:
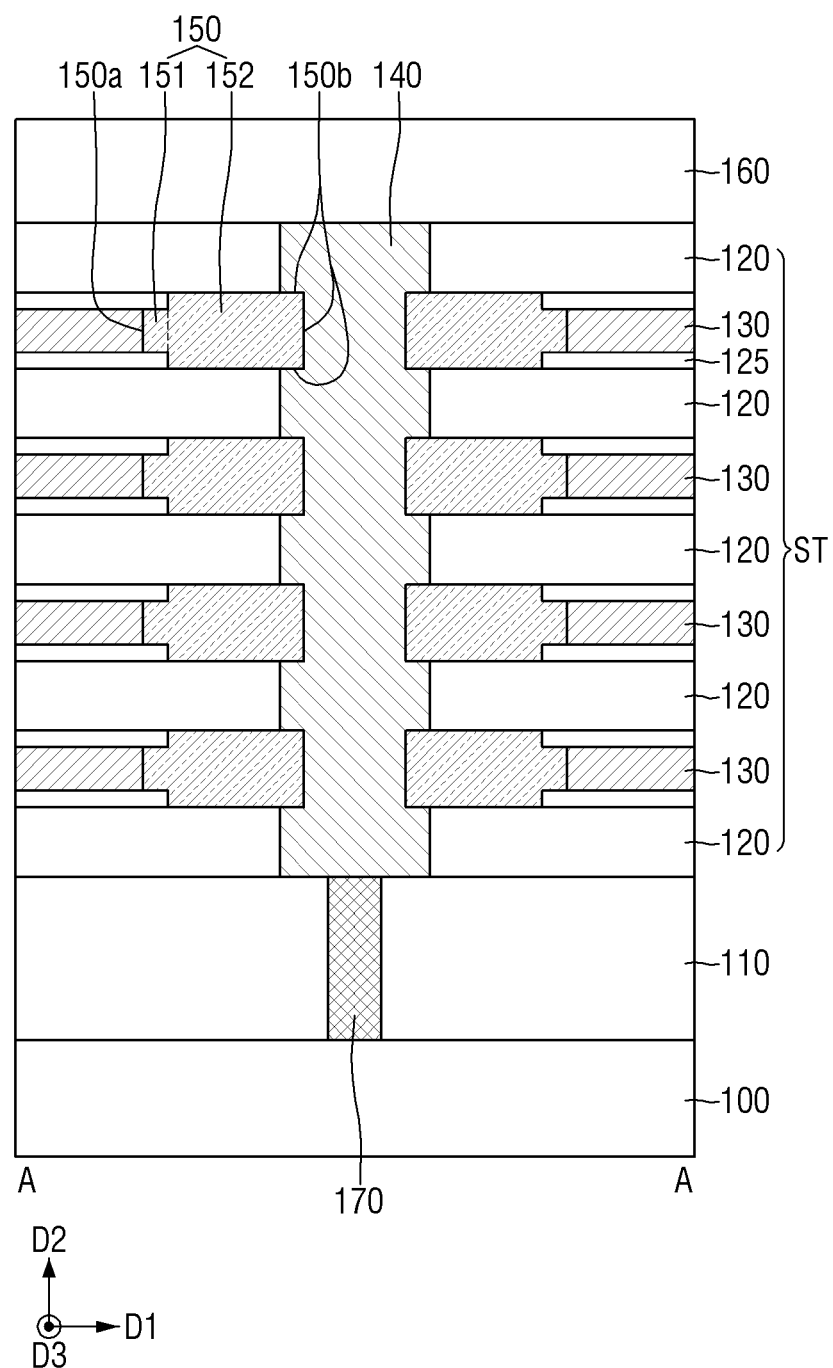

Referring to FIG. 11, the stacked structure ST according to some example embodiments may further include a second insulating film 125.

The second insulating film 125 may be provided between the first insulating film 120 and the first electrode 130. The first electrode 130 may be provided between the second insulating films 125. That is, the first insulating film 120, the second insulating film 125, the first electrode 130, and the second insulating film 125 may be sequentially stacked.

The second insulating film 125 may include a material having a higher resistance than the first electrode 130. For example, the second insulating film 125 may include an insulating material of nitride series or polysilicon. As an example, the second insulating film 125 may include, but not limited to, silicon nitride (SiN).

The OTS film 150 may include a first portion 151 and a second portion 152. The first portion 151 of the OTS film 150 may be a portion that comes into contact with the first electrode 130. The second portion 152 of the OTS film 150 may be a portion that comes into contact with the second electrode 140.

The first portion 151 of the OTS film 150 may overlap the second insulating film 125 in the second direction D2. The second portion 152 of the OTS film 150 may not overlap the second insulating film 125 in the second direction D2. The second portion 152 of the OTS film 150 may overlap the second insulating film 125 in the first direction D1.

In some example embodiments, the width of the first surface 150a in the second direction D2 is smaller than the width of the second surface 150b in the second direction D2. That is, the area of the portion in which the first electrode 130 and the OTS film 150 come into contact with each other differs from the area of the portion in which the second electrode 140 and the OTS film 150 come into contact with each other. For example, the area of the portion in which the first electrode 130 and the OTS film 150 come into contact with each other is smaller than the area of the portion in which the second electrode 140 and the OTS film 150 come into contact with each other. A semiconductor memory device with improved reliability can be fabricated accordingly.

Further, in a case where the second insulating film 125 is included, the area of the first surface 150a is smaller than a case where the second insulating film 125 is not included. Therefore, in some example embodiments, a difference between the area of the portion in which the first electrode 130 and the OTS film 150 come into contact with each other and the area of the portion in which the second electrode 140 and the OTS film 150 come into contact with each other may be maximized.

Figure 12:
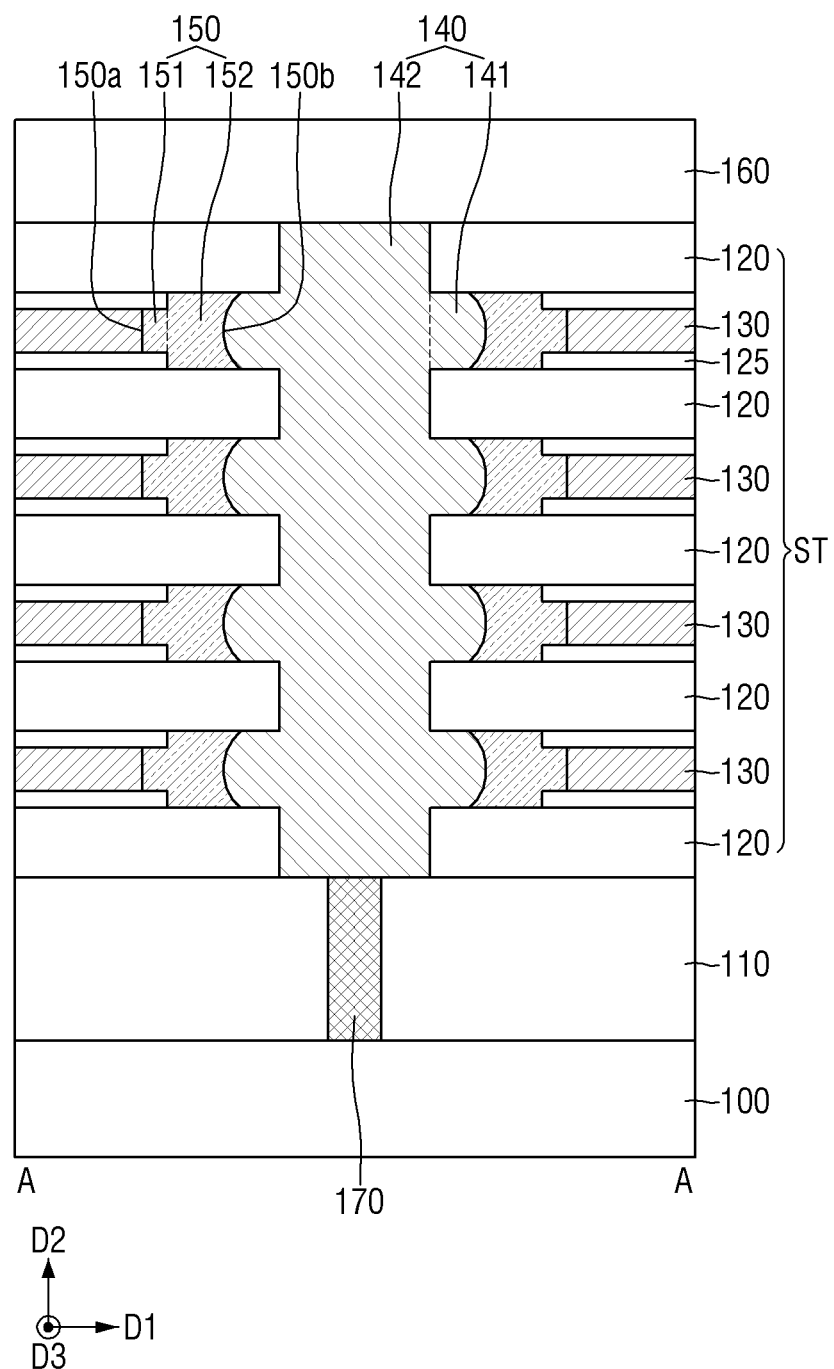

Referring to FIG. 12, the stacked structure ST further may includes a second insulating film 125, and the second surface 150b may be a curved surface.

In some example embodiments, as the stacked structure ST includes the second insulating film 125 and the second surface 150b has a curved surface, a difference between the area of the portion in which the first electrode 130 and the OTS film 150 come into contact with each other and the area of the portion in which the second electrode 140 and the OTS film 150 come into contact with each other may be maximized. A semiconductor memory device with improved reliability can be fabricated accordingly.

Figure 13:
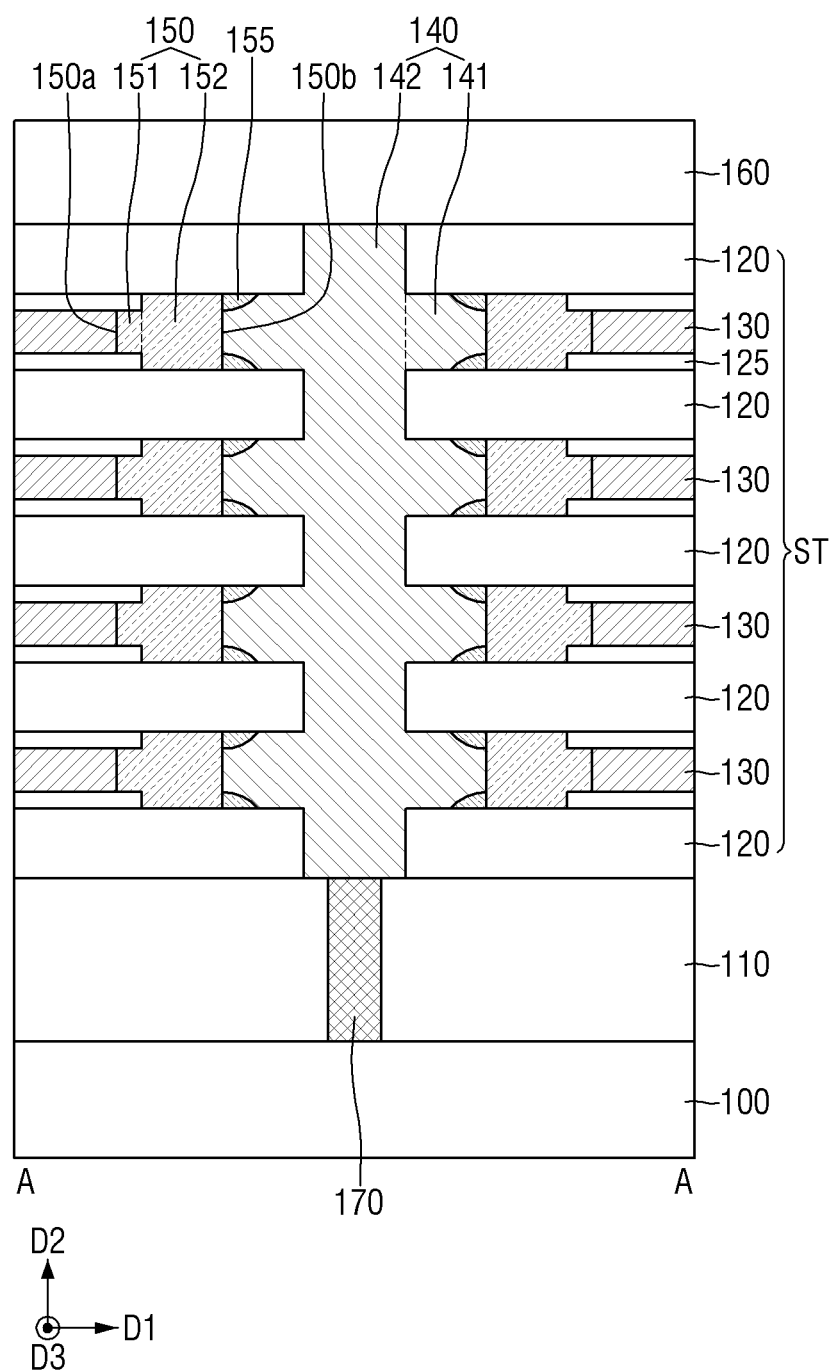

Referring to FIG. 13, the stacked structure ST may further include a second insulating film 125, and the semiconductor memory device according to some example embodiments may further include an OTS spacer film 155.

As described above, the OTS spacer film 155 may include the same material as the OTS film 150. The OTS spacer film 155 may perform the same function as the OTS film 150. Therefore, a difference in sum of the area of the portion in which the first electrode 130 and the OTS film 150 come into contact with each other, the area of the portion in which the second electrode 140 and the OTS film 150 come into contact with each other, and the area of the portion in which the second electrode 140 and the OTS spacer film 155 come into contact each other may be maximized. A semiconductor memory device with improved reliability can be fabricated accordingly.

Figure 14:
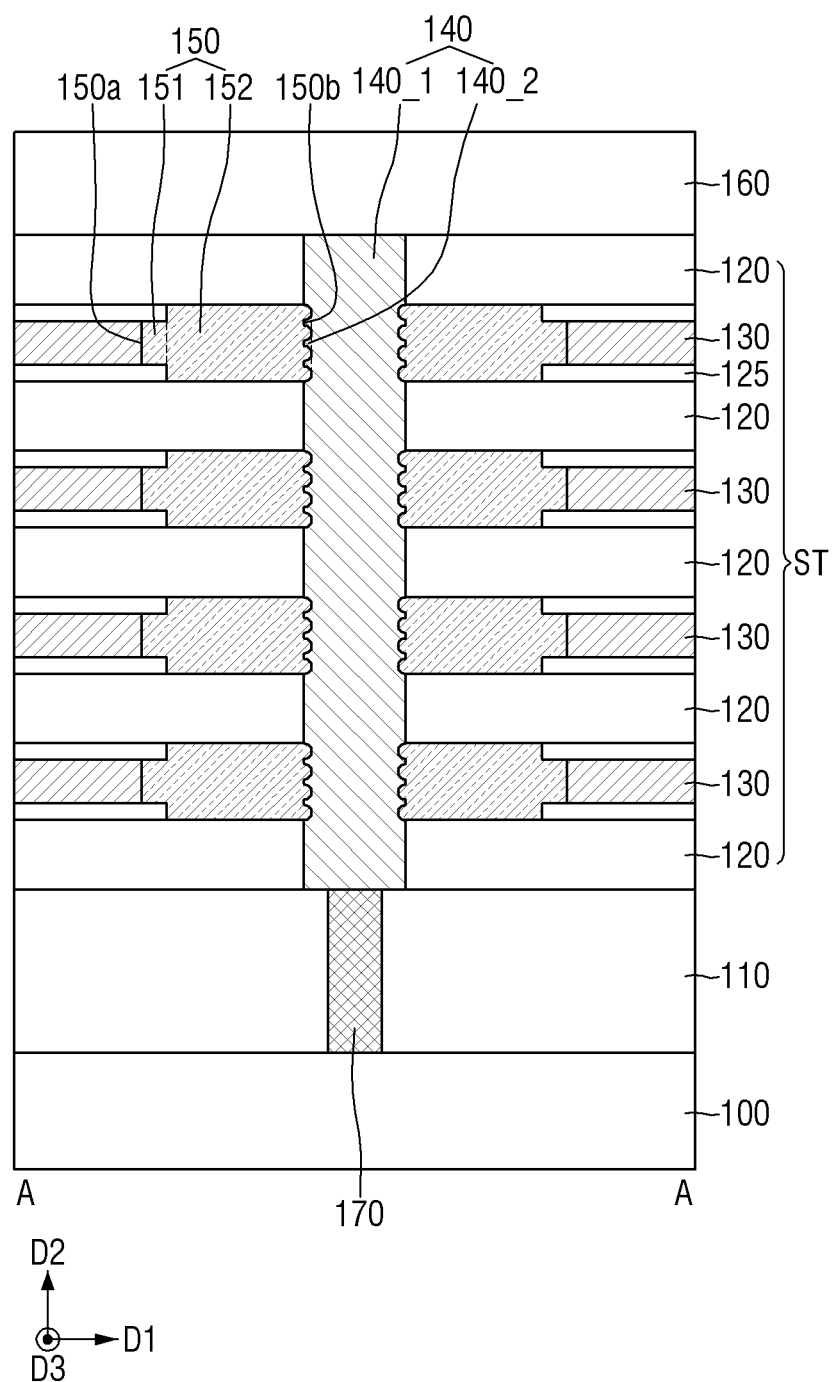

Referring to FIG. 14, the stacked structure ST may further include a second insulating film 125, and the second electrode 140 may include at least three or more protrusions 140_2.

As described above, since the second electrode 140 includes at least three or more protrusions 140_2, the area of the second surface 150b on which the second electrode 140 and the OTS film 150 come into contact with each other may increase. When the second insulating film 125 is included, the area of the first surface 150a on which the first electrode 130 and the OTS film 150 come into contact with each other may decrease as compared with the case where the second insulating film 125 is not included. Therefore, a difference between the area of the portion in which the first electrode 130 and the OTS film 150 come into contact with each other and the area of the portion in which the second electrode 140 and the OTS film 150 come into contact with each other may be maximized. A semiconductor memory device with improved reliability can be fabricated accordingly.

Hereinafter, a method of fabricating a semiconductor memory device according to some example embodiments will be described referring to FIGS. 15 to 20.

FIGS. 15 to 20 are diagrams showing sequentially processes of fabricating a semiconductor memory device having the cross section of FIG. 4.

Figure 15:
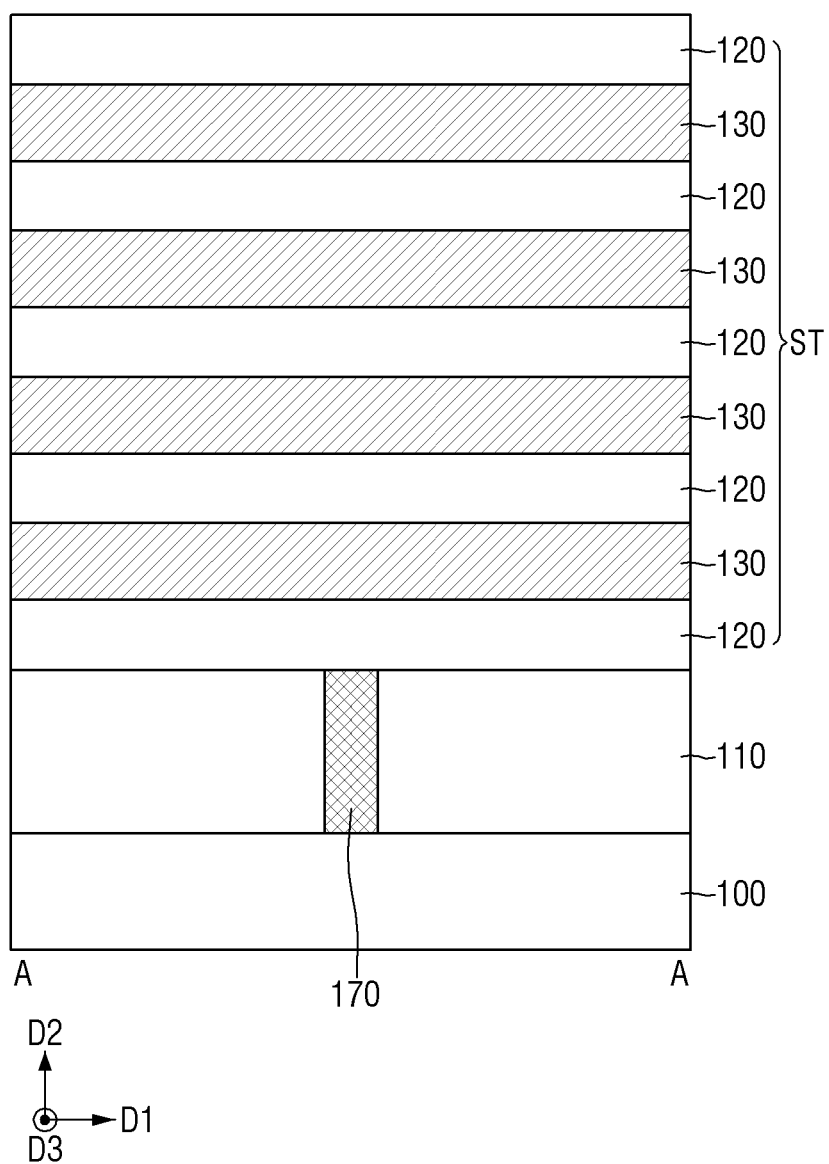
FIGS. 15 to 20 are diagrams showing sequential processes of fabricating a semiconductor memory device having the cross section of FIG. 4.

First, referring to FIG. 15, the substrate 100 may be provided. The first interlayer insulating film 110 is provided on the substrate 100. The via contact 170 may be provided inside the first interlayer insulating film 110. The via contact 170 may be electrically connected to a second electrode 140 to be formed later.

The stacked structure ST may be formed on the first interlayer insulating film 110. The stacked structure ST may include a plurality of first insulating films 120 and a plurality of first electrodes 130. The first insulating film 120 and the first electrode 130 may be alternately stacked in the second direction D2. The first electrode 130 may be interposed between the first insulating films 120.

Figure 16:
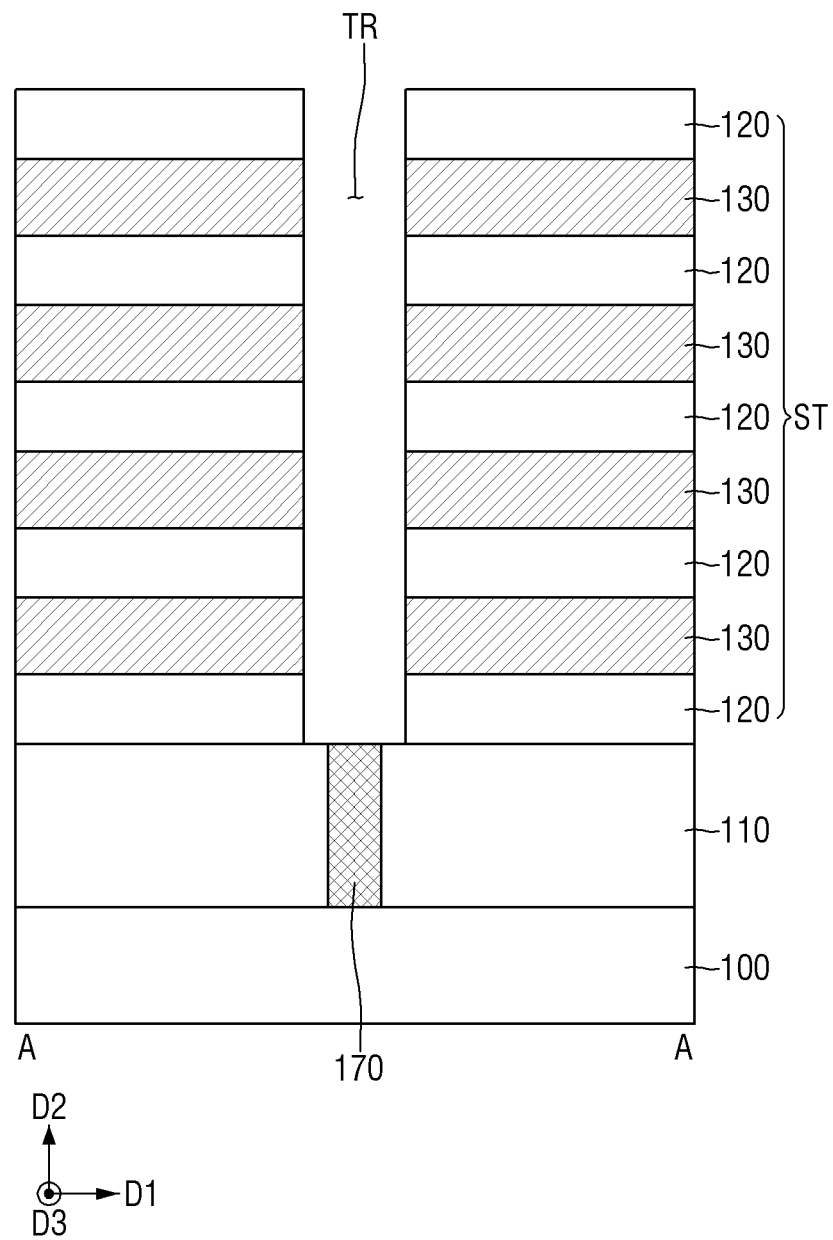

Referring to FIG. 16, a trench TR may be formed. The trench TR may penetrate the stacked structure ST in the second direction D2. The trench TR may expose the via contact 170. A width of the trench TR in the first direction D1 may be larger than a width of the via contact 170 in the first direction D1. The trench TR may expose some parts of the first insulating film 120 and the first electrode 130.

Figure 17:
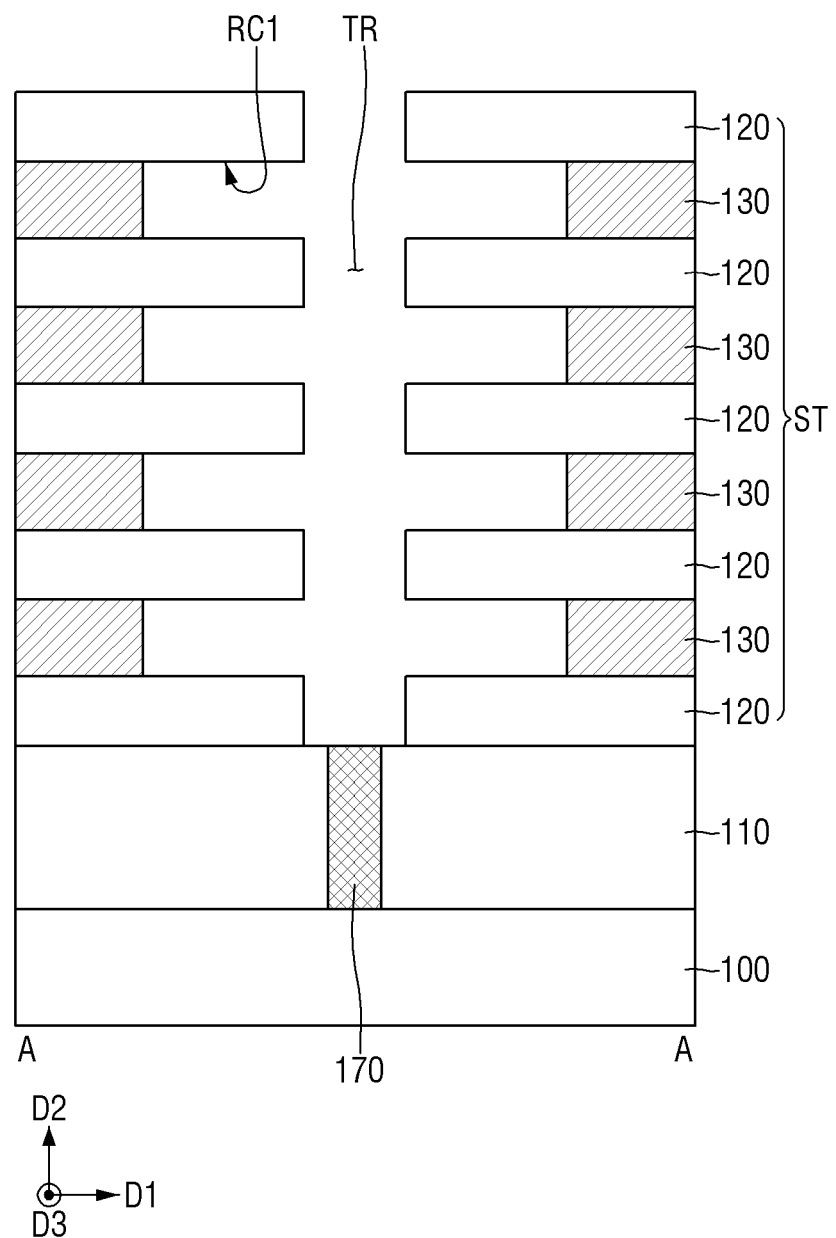

Referring to FIG. 17, a first recess RC1 may be formed. The first recess RC1 may be formed by removing a part of the first electrode 130 in the first direction D1.

For example, a part of the first electrode 130 may be laterally removed, using a wet etching process. Since the first electrode 130 and the first insulating film 120 have different types of etching selectivity from each other, the first insulating film 120 may not be removed, while the first electrode 130 is removed.

Figure 18:
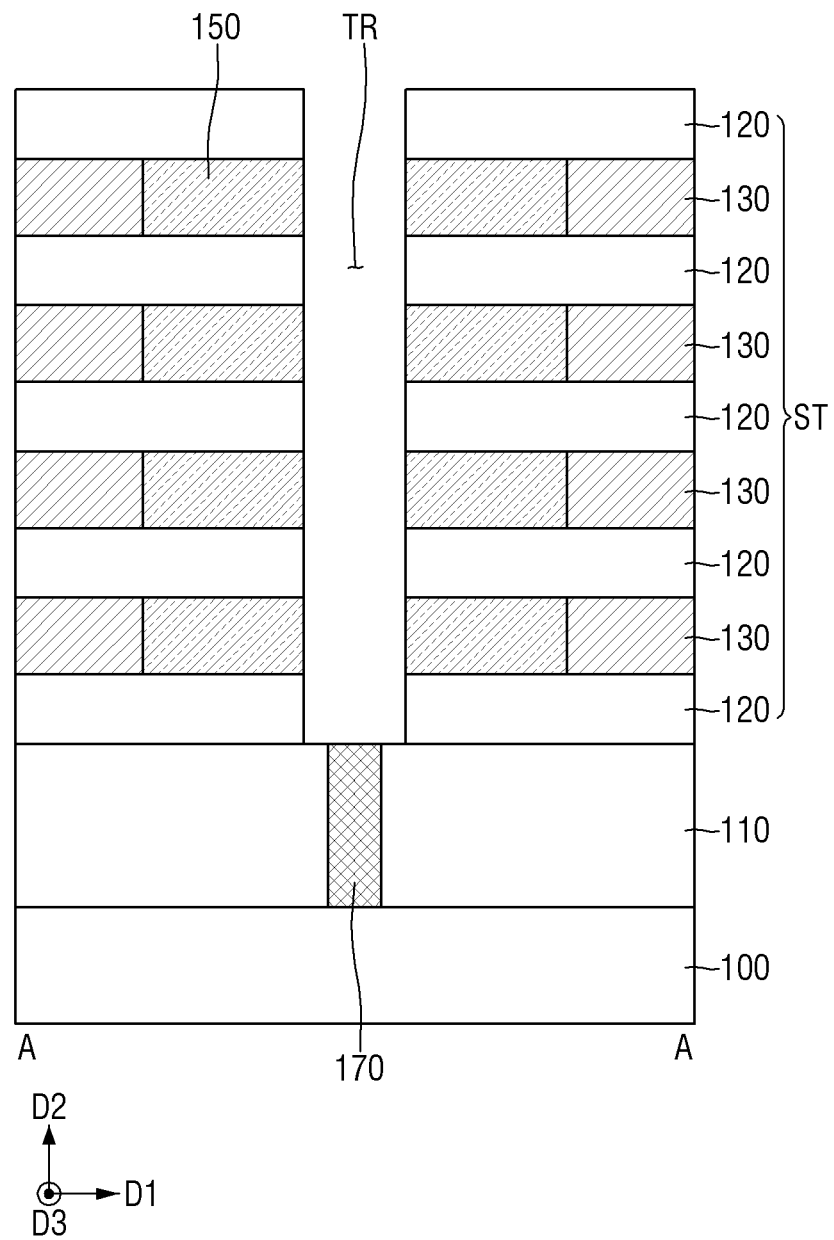

Referring to FIG. 18, the OTS film 150 that fills the first recess RC1 may be formed. The OTS film 150 may cover the first electrode 130. The OTS film 150 may come into contact with the first electrode 130. The OTS film 150 may cover the surface of the first insulating film 120 exposed by the first recess RC1. The OTS film 150 may include a chalcogenide material.

Figure 19:
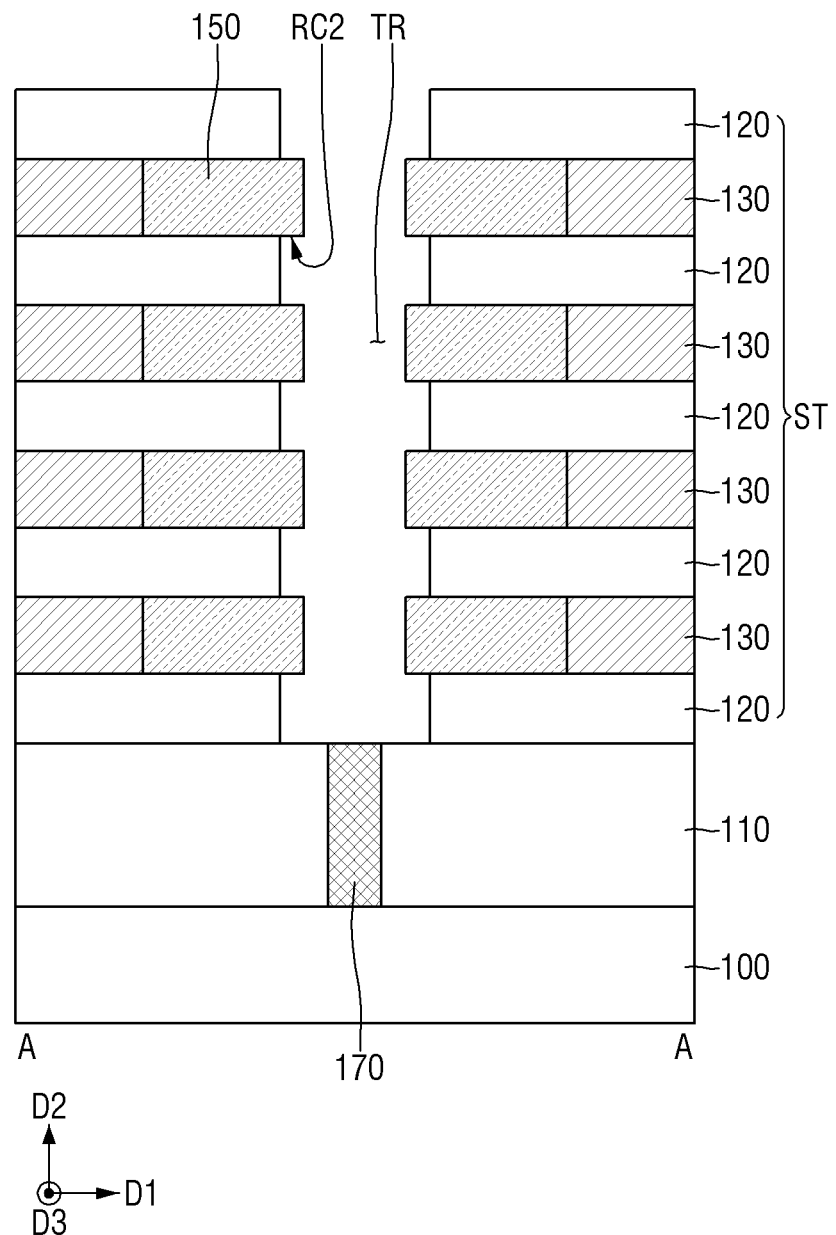

Referring to FIG. 19, the second recess RC2 may be formed. The second recess RC2 may be formed by removing a part of the first insulating film 120 in the first direction D1.

For example, a part of the first insulating film 120 may be laterally removed, using a wet etching process. Since the first electrode 130 and the first insulating film 120 have different types of etching selectivity from each other, the first electrode 130 may not be removed, while the first insulating film 120 is being removed.

Figure 20:
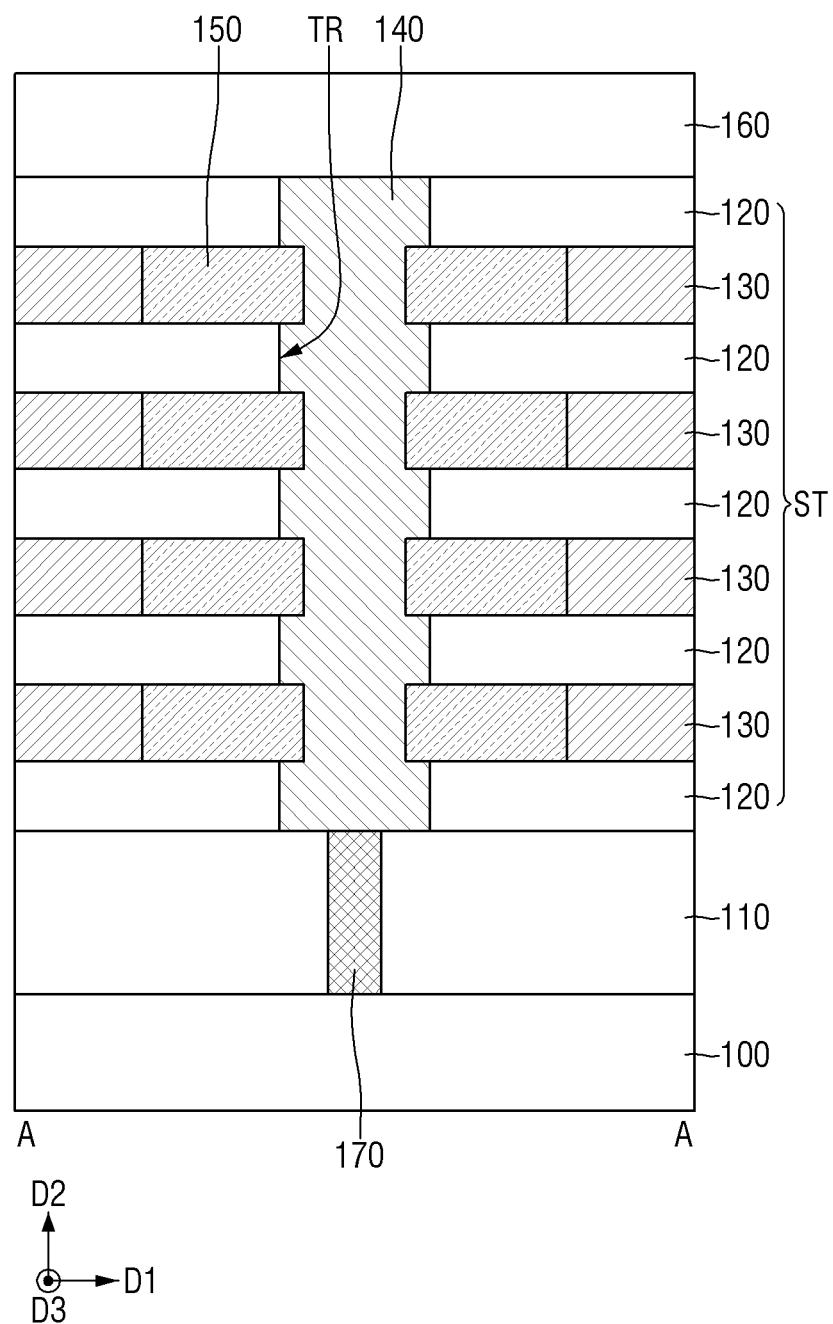

Referring to FIG. 20, a second electrode 140 that fills the second recess RC2 and the trench TR may be formed. The second electrode 140 fills the trench TR and may be connected to the via contact 170. The second electrode 140 may come into contact with the OTS film 150. The OTS film 150 may protrude from the end of the first insulating film 120. At least a part of the OTS film 150 may overlap the second electrode 140 in the second direction D2. Therefore, the area of the portion in which the OTS film 150 and the second electrode 140 come into contact with each other may increase.

The area of the first surface 150a on which the OTS film 150 and the first electrode 130 come into contact with each other is smaller than the area of the second surface 150b on which the OTS film 150 and the second electrode 140 come into contact with each other.

Hereinafter, the semiconductor memory device according to some example embodiments will be described referring to FIGS. 21 to 31.

Although the semiconductor memory device according to some example embodiments is shown as a self-selecting memory in the drawings, the technical idea of the present disclosure is not limited thereto.

Figure 21:
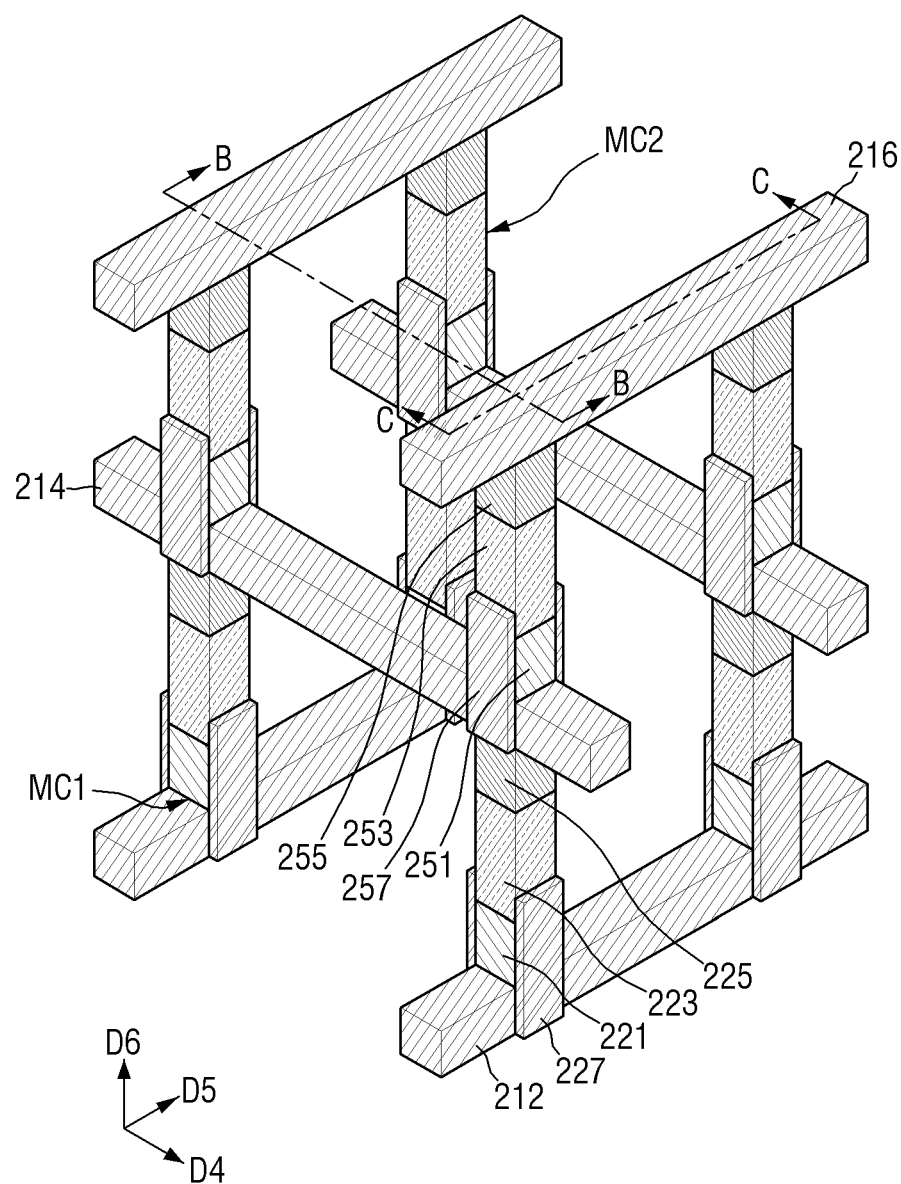
FIG. 21 is an exemplary perspective view of a semiconductor memory device according to some example embodiments.
Figure 22:
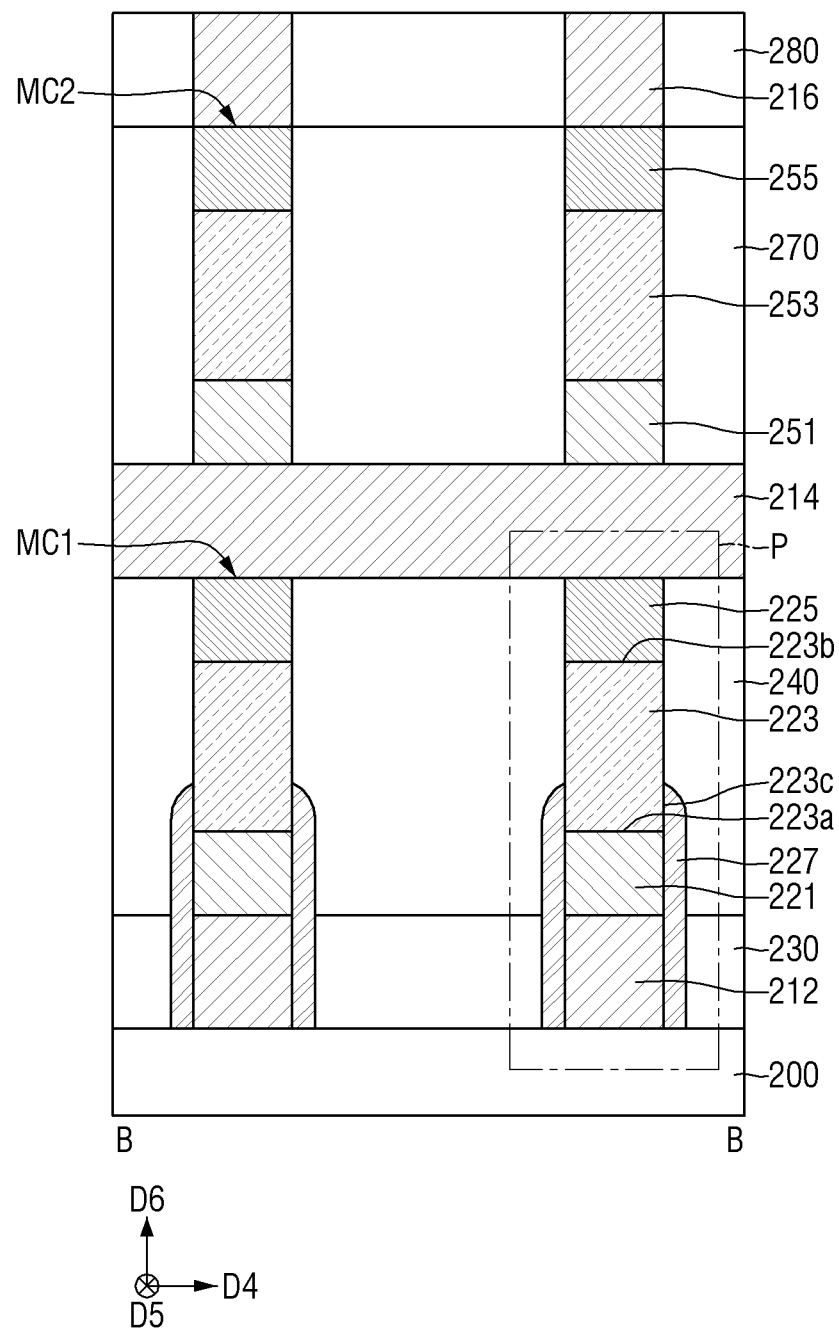
FIG. 22 is a cross-sectional view taken along a line B-B of FIG. 21.
Figure 23:
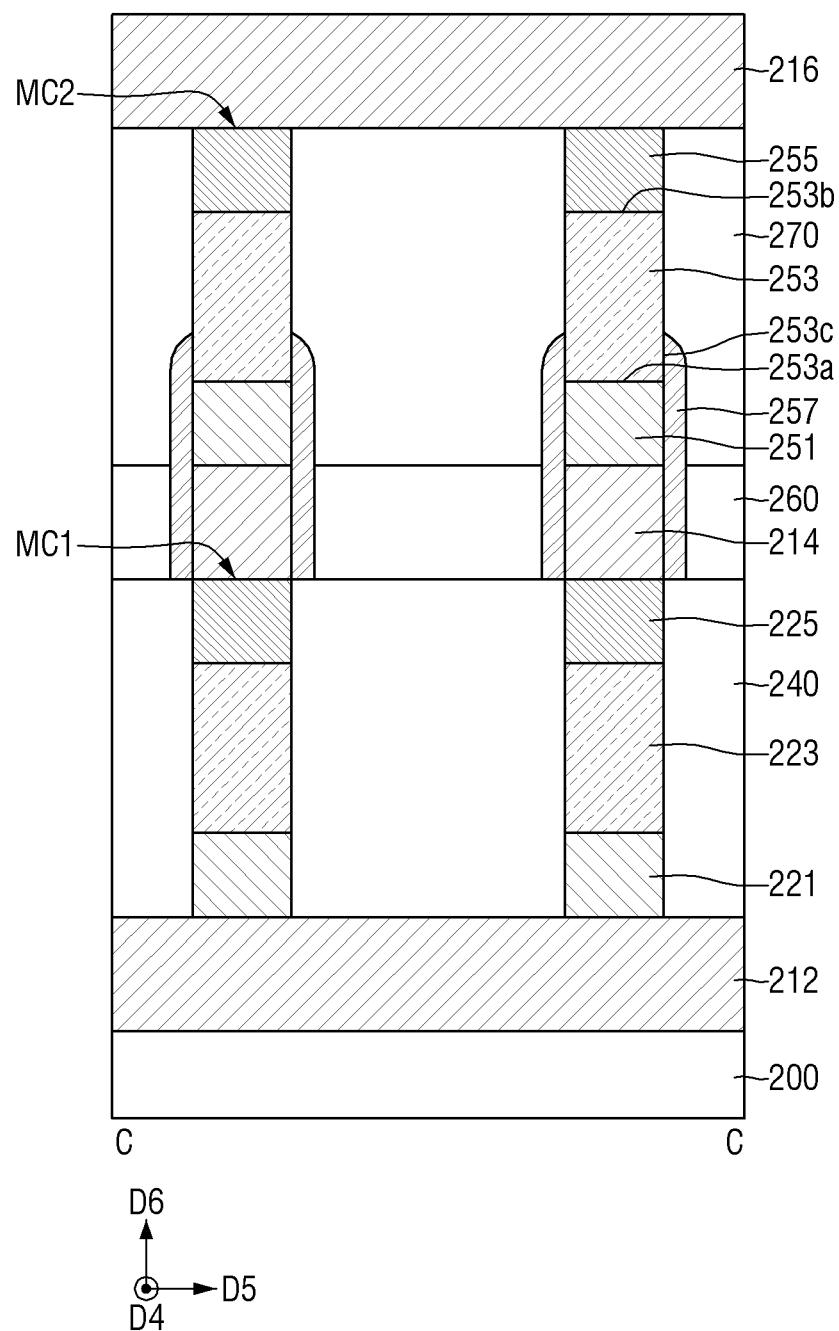
FIG. 23 is a cross-sectional view taken along a line C-C of FIG. 21.
Figure 24:
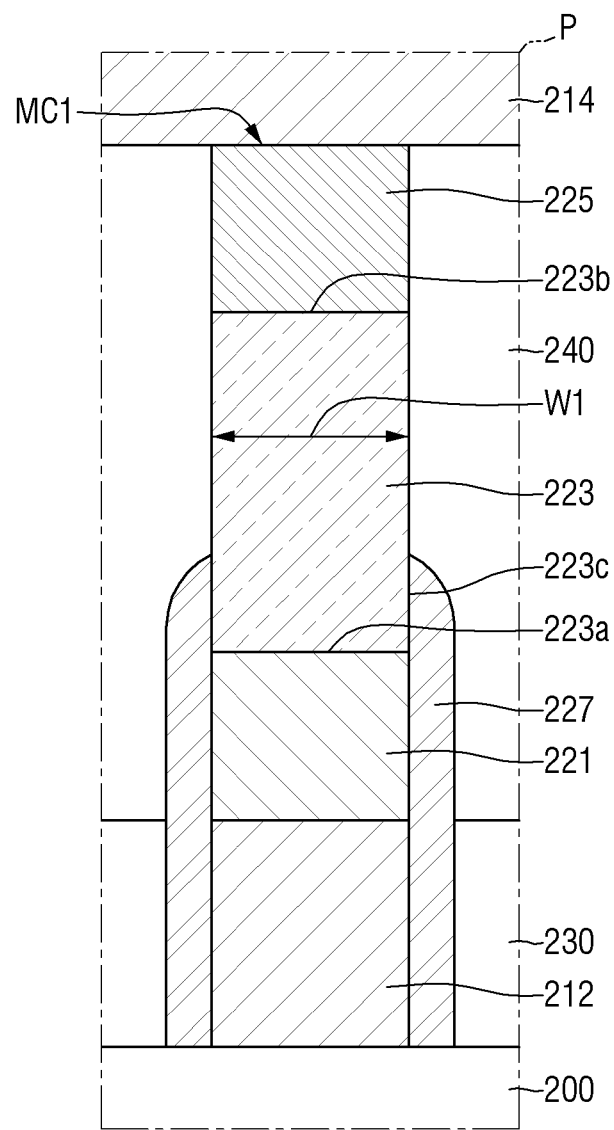
FIG. 24 is an enlarged view of a region P of FIG. 22.

FIG. 21 is an exemplary perspective view of the semiconductor memory device according to some example embodiments. FIG. 22 is a cross-sectional view taken along a line B-B of FIG. 21. FIG. 23 is a cross-sectional view taken along a line C-C of FIG. 21. FIG. 24 is an enlarged view of a region P of FIG. 22.

Referring to FIGS. 21 to 24, the semiconductor memory device according to some example embodiments may include a substrate 200, a first conductive line 212, a second conductive line 214, a third conductive line 216, a first memory cell MC1, a second memory cell MC2, a first electrode spacer film 227, and a second electrode spacer film 257.

The substrate 200 may be a semiconductor substrate. For example, the substrate 200 may be bulk silicon or silicon-on-insulator (SOI). The substrate 200 may be a silicon substrate or may include other materials, for example, silicon germanium, indium antimonide, lead tellurium compounds, indium arsenic, indium phosphide, gallium arsenide or gallium antimonide. Alternatively, the substrate 200 may have an epi-layer formed on the base substrate.

The first conductive line 212, the second conductive line 214, and the third conductive line 216 may be provided on the substrate 200.

The first conductive line 212 may extend in a fifth direction D5. At least one or more first conductive lines 212 may be provided. The respective first conductive lines 212 may be separated from each other in the fourth direction D4. In the present specification, the fourth direction D4, the fifth direction D5, and the sixth direction D6 may intersect each other. The fourth direction D4, the fifth direction D5, and the sixth direction D6 may be substantially perpendicular to each other.

The first conductive line 212 may be the first conductive line 10 of FIG. 1. That is, the first conductive line 212 may function as a word line in the semiconductor memory device according to some example embodiments.

The second conductive line 214 may be provided on the first conductive line 212. At least one or more second conductive lines 214 may be provided. Each second conductive line 214 may be separated from the first conductive line 212 in the sixth direction D6. Each second conductive line 214 may extend in the fourth direction D4. Each second conductive lines 214 may be separated from each other in the fifth direction D5.

The second conductive line 214 may be the second conductive line 15 of FIG. 1. That is, the second conductive line 214 may function as a bit line in the semiconductor memory device according to some example embodiments.

The third conductive line 216 may be provided on the second conductive line 214. At least one or more third conductive lines 216 may be provided. Each third conductive line 216 may be separated from the first and second conductive lines 212 and 214 in the sixth direction D6. Each third conductive line 216 may extend in the fifth direction D5. The respective third conductive lines 216 may be separated from each other in the fourth direction D4.

The third conductive line 216 may be the first conductive line 10 of FIG. 1. That is, the third conductive line 216 may function as a word line in the semiconductor memory device according to some example embodiments.

In some example embodiments, the first and third conductive lines 212 and 216 may each extend in the fifth direction D5, and the second conductive line 214 may extend in the fourth direction D4. The second conductive line 214 may be interposed between the first and third conductive lines 212 and 216.

The first to third conductive lines 212, 214, and 216 may each include a conductive material. For example, each of the first to third conductive lines 212, 214, and 216 may include, but not limited to, at least one of tungsten (W), tungsten nitride (WN), gold (Au), silver (Ag), copper (Cu), aluminum (Al), titanium aluminum nitride (TiAlN), nickel (Ni), cobalt (Co), chromium (Cr), tin (Sn), zinc (Zn), indium tin oxide (ITO), and combinations thereof.

The first to third conductive lines 212, 214, and 216 may include the same material as each other, or may include different materials from each other. In the present specification, the first to third conductive lines 212, 214, and 216 are each described as including tungsten (W).

In some example embodiments, a first interlayer insulating film 230 may be provided between the first conductive lines 212. The first interlayer insulating film 230 may be placed on the substrate 200. The first interlayer insulating film 230 may be interposed between the first conductive lines 212 to insulate each first conductive line 212.

A second interlayer insulating film 260 may be provided between the second conductive lines 214. The second interlayer insulating film 260 may be provided on the first memory cells MC1. The second interlayer insulating film 260 may be interposed between the second conductive lines 214 to insulate each second conductive line 214.

A third interlayer insulating film 280 may be provided between the third conductive lines 216. The third interlayer insulating film 280 may be provided on the second memory cells MC2. The third interlayer insulating film 280 may be interposed between the third conductive lines 216 to insulate each third conductive line 216.

The first to third interlayer insulating films 230, 260, and 280 may each include an insulating material of oxide series. For example, the first to third interlayer insulating films 230, 260, and 280 may each include, but not limited to, at least one of silicon oxide, silicon oxynitride, and a low dielectric constant (low-k) material having a smaller dielectric constant than silicon oxide.

The first memory cell MC1 may be provided between the first conductive line 212 and the second conductive line 214. The first memory cell MC1 may be placed at the intersection between the first conductive line 212 and the second conductive line 214. One end of the first memory cell MC1 may be connected to the word line of the semiconductor memory device. The other end of the first memory cell MC1 may be connected to the bit line of the semiconductor memory device. At least one or more first memory cells MC1 may be provided. Each first memory cells MC1 may be separated in the fourth direction D4 or may be separated in the fifth direction D5. The first memory cells MC1 may extend in the sixth direction D6.

The first memory cells MC1 may include a first electrode 221, a first OTS film 223, and a second electrode 225.

The first electrode 221, the first OTS film 223, and the second electrode 225 may be aligned sequentially in the sixth direction D6. The first electrode 221 may be placed on the first conductive line 212. The first OTS film 223 may be placed on the first electrode 221. The second electrode 225 may be placed on the first OTS film 223.

The first electrode 221 may be connected to the first conductive line 212. The first electrode 221 may come into contact with the first conductive line 212. The first electrode 221 may include a conductive material. As an example, the first electrode 221 may include carbon (C). In contrast, the first electrode 221 may include at least one of a metal such as tungsten (W), platinum (Pt), palladium (Pd), rhodium (Rh), ruthenium (Ru), iridium (Ir), copper (Cu), aluminum (Al), titanium (Ti), and tantalum (Ta), a metal nitride such as titanium nitride (TiN), and combinations thereof.

The second electrode 225 may be provided on the first electrode 221. The second electrode 225 may be connected to the second conductive line 214. The second electrode 225 may come into contact with the second conductive line 214. The second electrode 225 may include a conductive material. As an example, the second electrode 225 may include carbon (C). On the other hand, the second electrode 225 may include at least one of a metal such as tungsten (W), platinum (Pt), palladium (Pd), rhodium (Rh), ruthenium (Ru), iridium (Ir), copper (Cu), aluminum (Al), titanium (Ti), and tantalum (Ta), a metal nitride such as titanium nitride (TiN), and combinations thereof.

The first OTS film 223 may be provided between the first electrode 221 and the second electrode 225. The first OTS film 223 may be connected to the first electrode 221 and the second electrode 225. The first OTS film 223 may come into contact with each of the first electrode 221 and the second electrode 225. For example, the first OTS film 223 may include a first surface 223a that is in contact with the first electrode 221, and a second surface 223b that is in contact with the second electrode 225. Although the area of the first surface 223a and the area of the second surface 223b are shown as being the same, the example embodiment is not limited thereto.

In some example embodiments, the width W1 of the first OTS film 223 in the fourth direction D4 may be constant as it goes away from the substrate 200. From the viewpoint of the cross section, the shape of the cross section of the first OTS film 223 may be, but not limited to, rectangular.

In some example embodiments, the first OTS film 223 may function as an information storage element of the first memory cell MC1. The first OTS film 223 may include a chalcogenide material. The chalcogenide material may include a compound in which at least one of S, Te and Se as the chalcogen elements is combined with at least one of Ge, Sb, Bi, Al, Tl, Sn, Zn, As, Si, In, Ti, Ga and P.

As an example, the first OTS film 223 may include at least one of GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

The semiconductor memory device according to some example embodiments may store data through the mobility of ions included in the first OTS film 223. For example, when a voltage is applied to the first electrode 221 and the second electrode 225, the ions included in the first OTS film 223 may move to the first surface 223a or the second surface 223b. As an example, the first OTS film 223 may include selenium (Se) ions. When a voltage is applied to the first electrode 221 and the second electrode 225, selenium (Se) ions in the first OTS film 223 may move.

For example, the selenium (Se) ions concentrated in the first electrode 221 according to the polarity of the first memory cell MC1 may generate a first threshold voltage indicating a state of logical "1". The selenium (Se) ions concentrated in the second electrode 225 may generate a second threshold voltage indicating a state of logical "0". The first threshold voltage and the second threshold voltage may be different from each other. The larger the difference between the first threshold voltage and the second threshold voltage is, the more reliable the semiconductor memory device may be.

The first electrode spacer film 227 may be provided on a part of the side wall of the first memory cell MC1. For example, the first electrode spacer film 227 may cover a part of the side wall of the first OTS film 223. The first electrode spacer film 227 may wrap at least two side walls of the first OTS film 223. However, the technical idea of the present disclosure is not limited thereto.

The first electrode spacer film 227 may cover the side wall of the first electrode 221 and the side wall of the first conductive line 212. The first electrode spacer film 227 may cover at least two side walls of the first electrode 221 and at least two side walls of the first conductive line 212.

The first electrode spacer film 227 may include the same material as that included in the first electrode 221. As an example, the first electrode spacer film 227 may include carbon (C). On the other hand, the first electrode spacer film 227 may include at least one of a metal such as tungsten (W), platinum (Pt), palladium (Pd), rhodium (Rh), ruthenium (Ru), iridium (Ir), copper (Cu), aluminum (Al), titanium (Ti), and tantalum (Ta), metal nitride such as titanium nitride (TiN), and combinations thereof.

Since the first electrode spacer film 227 includes the same material as the first electrode 221, the first electrode spacer film 227 may perform the same function as the first electrode 221.

For example, the logical state of the data stored in the first OTS film 223 may be based on the concentration of selenium (Se) ions on the surface of the first electrode 221, the surface of the second electrode 225, and the surface of the first electrode spacer film 227 that are in contact with the first OTS film 223. Further, the logical state of the data stored in the first OTS film 223 may be based on the polarity of the program voltage. The first OTS film 223 may include a first surface 223a that is in contact with the first electrode 221, a second surface 223b that is in contact with the second electrode 225, and a third surface 223c that is in contact the first electrode spacer film 227.

The logical state of the data stored in the first OTS film 223 may be based on the concentration of selenium (Se) ions on the first surface 223a, the second surface 223b, and the third surface 223c. For example, when the concentration of the second surface concentration of the third surface 223c, the first OTS film 223 may be in the state of logical "1". When the concentration of the second surface 223b is smaller than the sum of the concentration of the first surface 223a and the concentration of the third surface 223c, the first OTS film 223 may be in the state of logical "0".

In some example embodiments, as a difference between the concentration of selenium (Se) ions at the portion in which the first electrode 221 comes into contact with the first OTS film 223 and the concentration of selenium (Se) ions at the portion in which the second electrode 225 comes into contact with the first OTS film 223 is large, the reliability can be improved. In the case of the semiconductor memory device according to some example embodiments, since the first electrode spacer film 227 is further included, the area of the portion in which the first electrode 221, the first electrode spacer film 227, and the first OTS film 223 come into contact with each other may be larger than the area of the portion in which the second electrode 225 and the first OTS film 223 come into contact with each other. A semiconductor storage element with improved reliability can be provided accordingly.

The semiconductor memory device according to some example embodiments may further include a first cell insulating film 240. The first cell insulating film 240 may wrap the first memory cell MC1. The first cell insulating film 240 may electrically insulate the first memory cells MC1. The first cell insulating film 240 may include an insulating material of oxide series. For example, the first cell insulating film 240 may include at least one of silicon oxide, silicon oxycarbide, and a low thermal conductivity material having a lower thermal conductivity than silicon oxide.

As an example, the first cell insulating film 240 may include, but not limited to, at least one of $SiO_2$, SiOC, SOG (Spin-On glass), SOD (Spin-On Dielectric), HDP (High Density Plasma) oxide, FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), TEOS (Tetra Ethyl Ortho Silicate), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bisbenzocyclobutenes), SiLK, polyimide, porous polymeric material, and combinations thereof. In some example embodiments, the first cell insulating film 240 may be a FOX (Flowable Oxide).

The second memory cell MC2 may be provided between the second conductive line 214 and the third conductive line 216. The second memory cell MC2 may be placed at the intersection between the second conductive line 214 and the third conductive line 216. At least one or more second memory cells MC2 may be provided. Each second memory cell MC2 may be separated in the fourth direction D4 or may be separated in the fifth direction D5. The second memory cells MC2 may overlap the first memory cells MC1 in the sixth direction D6.

The second memory cell MC2 may include a third electrode 251, a second OTS film 253, and a fourth electrode 255.

The third electrode 251, the second OTS film 253, and the fourth electrode 255 may be aligned sequentially in the sixth direction D6. The third electrode 251 may be placed on the second conductive line 214. The second OTS film 253 may be placed on the third electrode 251. The fourth electrode 255 may be placed on the second OTS film 253.

The third electrode 251 may be connected to the second conductive line 214. The third electrode 251 may come into contact with the second conductive line 214. The third electrode 251 may include a conductive material. As an example, the third electrode 251 may include carbon (C). On the other hand, the third electrode 251 may include at least one of a metal such as tungsten (W), platinum (Pt), palladium (Pd), rhodium (Rh), ruthenium (Ru), iridium (Ir), copper (Cu), aluminum (Al), titanium (Ti), and tantalum (Ta), a metal nitride such as titanium nitride (TiN), and combinations thereof.

The fourth electrode 255 may be provided on the third electrode 251. The fourth electrode 255 may be connected to the third conductive line 216. The fourth electrode 255 may come into contact with the third conductive line 216. The fourth electrode 255 may include a conductive material. As an example, the fourth electrode 255 may include carbon (C). On the other hand, the fourth electrode 255 may include at least one of a metal such as tungsten (W), platinum (Pt), palladium (Pd), rhodium (Rh), ruthenium (Ru), iridium (Ir), copper (Cu), aluminum (Al), titanium (Ti), and tantalum (Ta), a metal nitride such as titanium nitride (TiN), and combinations thereof.

The second OTS film 253 may be provided between the third electrode 251 and the fourth electrode 255. The second OTS film 253 may be connected to the third electrode 251 and the fourth electrode 255. The second OTS film 253 may come into contact with each of the third electrode 251 and the fourth electrode 255. For example, the second OTS film 253 may include a fourth surface 253a that is in contact with the third electrode 251, and a fifth surface 253b that is in contact with the fourth electrode 255. Although the area of the fourth surface 253a and the area of the fifth surface 253b are shown as being the same, the example embodiment is not limited thereto.

In some example embodiments, the second OTS film 253 may function as an information storage element of the second memory cell MC2. The second OTS film 253 may include a chalcogenide material. The chalcogenide material may include a compound in which at least one of S, Te and Se as the chalcogen elements is combined with at least one of Ge, Sb, Bi, Al, Tl, Sn, Zn, As, Si, In, Ti, Ga and P.

As an example, the second OTS film 253 may include at least one of GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeالسن, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

The semiconductor memory device according to some example embodiments may store data through the mobility of ions included in the second OTS film 253. For example, when a voltage is applied to the third electrode 251 and the fourth electrode 255, ions included in the second OTS film 253 may move to the fourth surface 253a or the fifth surface 253b. As an example, the second OTS film 253 may include selenium (Se) ions. When a voltage is applied to the third electrode 251 and the fourth electrode 255, selenium (Se) ions in the second OTS film 253 may move.

The second electrode spacer film 257 may be provided on a part of the side wall of the second memory cell MC2. For example, the second electrode spacer film 257 may cover a part of the side wall of the second OTS film 253. The second electrode spacer film 257 may wrap at least two side walls of the second OTS film 253. However, the technical idea of the present disclosure is not limited thereto.

The second electrode spacer film 257 may cover the side wall of the third electrode 251 and the side wall of the second conductive line 214. The second electrode spacer film 257 may cover at least two side walls of the third electrode 251 and at least two side walls of the second conductive line 214.

In some example embodiments, the second electrode spacer film 257 does not overlap the first electrode spacer film 227 in the sixth direction D6. The first electrode spacer film 227 and the second electrode spacer film 257 may be formed through different processes from each other.

The second electrode spacer film 257 may include the same material as that included in the third electrode 251. As an example, the second electrode spacer film 257 may include carbon (C). On the other hand, the second electrode spacer film 257 may include at least one of metals such as tungsten (W), platinum (Pt), palladium (Pd), rhodium (Rh), ruthenium (Ru), iridium (Ir), copper (Cu), aluminum (Al), titanium (Ti), and tantalum (Ta), metal nitrides such as titanium nitride (TiN), and combinations thereof.

Since the second electrode spacer film 257 includes the same material as the third electrode 251, the second electrode spacer film 257 may perform the same function as the third electrode 251.

For example, the logical state of the data stored in the second OTS film 253 may be based on the concentration of selenium (Se) ions on the surface of the third electrode 251, the surface of the fourth electrode 255, and the surface of the second electrode spacer film 257 that are in contact with the second OTS film 253. Further, the logical state of the data stored in the second OTS film 253 may be based on the polarity of the program voltage. The second OTS film 253 may include a fourth surface 253a that is in contact with the third electrode 251, a fifth surface 253b that is in contact with the fourth electrode 255, and a sixth surface 253c that is in contact with the second electrode spacer film 257.

The logical state of the data stored in the second OTS film 253 may be based on the concentration of selenium (Se) ions on the fourth surface 253a, the fifth surface 253b, and the sixth surface 253c. For example, when the concentration of the fifth surface 253b is higher than the sum of the concentration of the fourth surface 253a and the concentration of the sixth surface 253c, the second OTS film 253 may be in the state of logical "1". When the concentration of the fifth surface 253b is smaller than the sum of the concentration of the fourth surface 253a and the concentration of the sixth surface 253c, the second OTS film 253 may be in the state of logical "0".

In some example embodiments, as the difference between the concentration of selenium (Se) ions at the portion in which the third electrode 251 comes into contact with the second OTS film 253 and the concentration of selenium (Se) ions at the portion in which the fourth electrode 255 comes into contact with the second OTS film 253 is large, the reliability can be improved. In the case of the semiconductor memory device according to some example embodiments, since the second electrode spacer film 257 is further included, the area of the portion in which the third electrode 251 and the second electrode spacer film 257 come into contact with the second OTS film 253 may be larger than the area of the portion in which the fourth electrode 255 comes into contact with the second OTS film 253. A semiconductor storage element with improved reliability can be provided accordingly.

The semiconductor memory device according to some example embodiments may further include a second cell insulating film 270. The second cell insulating film 270 may wrap the second memory cell MC2. The second cell insulating film 270 may electrically insulate the second memory cells MC2. The second cell insulating film 270 may include an insulating material of oxide series. For example, the second cell insulating film 270 may include at least one of silicon oxide, silicon oxycarbide, and a low thermal conductivity material having a lower thermal conductivity than silicon oxide.

As an example, the second cell insulating film 270 may include, but not limited to, at least one of $SiO_2$, SiOC, SOG (Spin-On glass), SOD (Spin-On Dielectric), HDP (High Density Plasma) oxide, FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), TEOS (Tetra Ethyl Ortho Silicate), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof. In some example embodiments, the second cell insulating film 270 may be a FOX (Flowable Oxide).

FIGS. 25 to 31 are exemplary diagrams for explaining a semiconductor memory device according to some example embodiments. For reference, FIGS. 25 to 31 may be exemplary diagrams in which a region P of FIG. 22 is enlarged.

Figure 25:
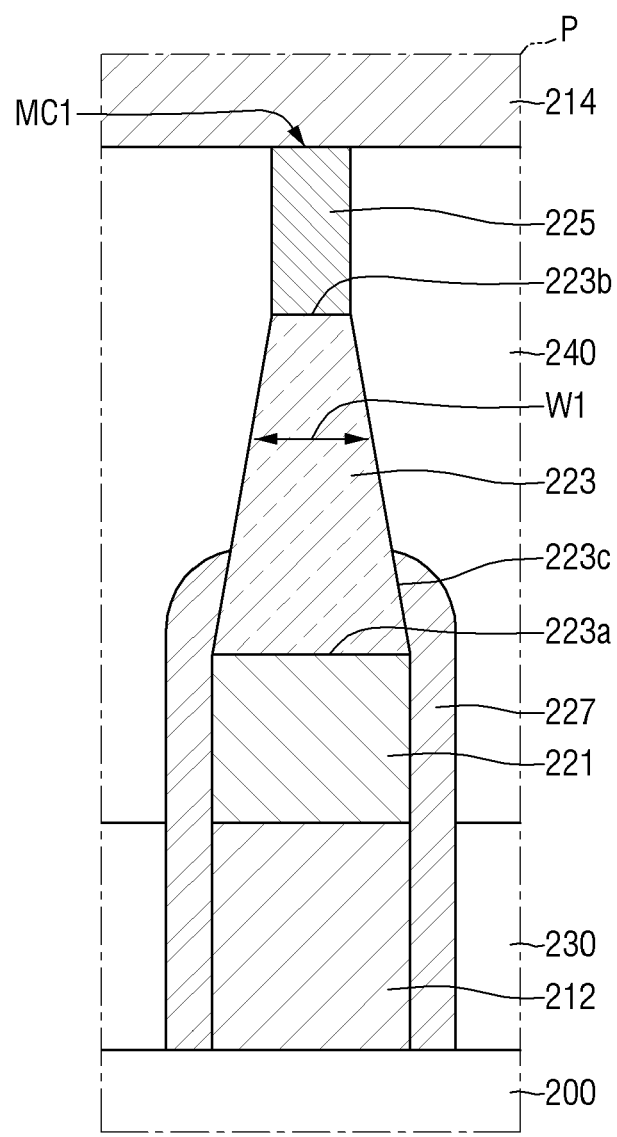
FIGS. 25 to 31 are exemplary diagrams for explaining a semiconductor memory device according to some example embodiments.

First, referring to FIG. 25, the cross section of the first OTS film 223 may be trapezoidal.

A width W1 of the first OTS film 223 in the fourth direction D4 may gradually decrease as it goes away from the substrate 200. The width of the first surface 223*a* may be larger than the width of the second surface 223*b*. That is, from the viewpoint of the cross section, the first OTS film 223 may have a trapezoidal shape in which a length of a side adjacent to the first electrode 221 is larger than a length of a side adjacent to the second electrode 225 among the two parallel sides.

The area of the second surface 223*b* on which the first OTS film 223 and the second electrode 225 come into contact with each other may be smaller than the sum of the area of the first surface 223*a* on which the first OTS film 223 and the first electrode 221 come into contact with each other and the area of the third surface 223*c* on which the first OTS film 223 and the first electrode spacer film 227 come into contact with each other. That is, according to some example embodiments, the difference between the area of the portion in which the first OTS film 223 comes into contact with the first electrode 221 and the area of the portion in which the first OTS film 223 comes into contact with the second electrode 225 may be maximized. As a result, it is possible to provide a semiconductor storage element with further improved reliability.

Figure 26:
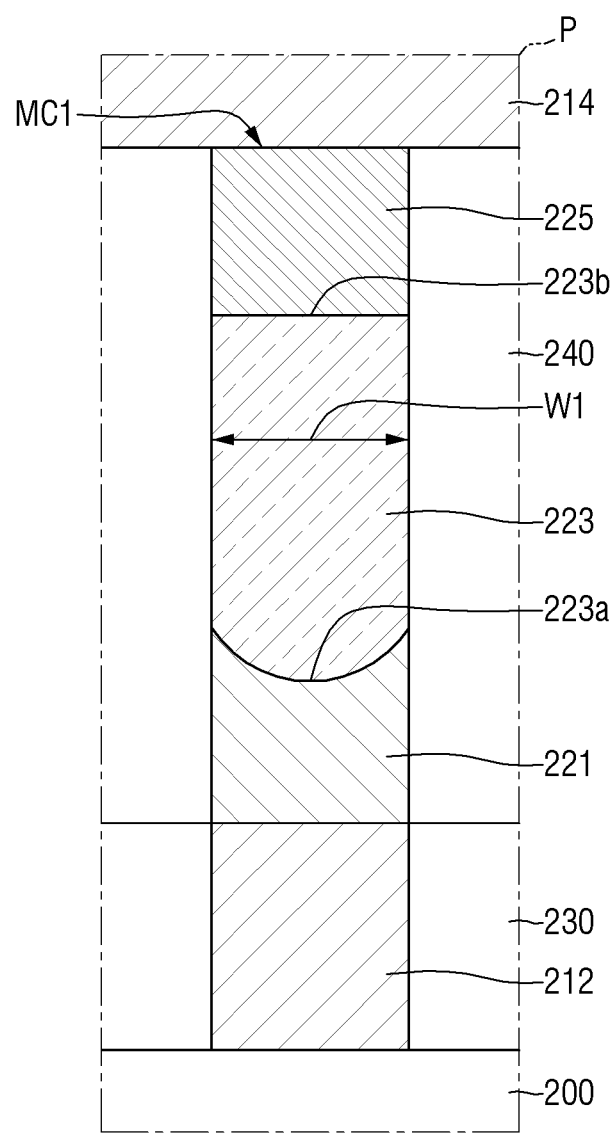

Referring to FIG. 26, from the viewpoint of the cross section, the first surface 223*a* may be a curved line. The first surface 223*a* may be convex toward the first electrode 221. The first surface 223*a* may be concave toward the second electrode 225.

From the viewpoint of the cross section, since the first surface 223*a* is a curved line and the second surface 223*b* is a straight line, the area of the first surface 223*a* may be larger than the area of the second surface 223*b*.

Figure 27:
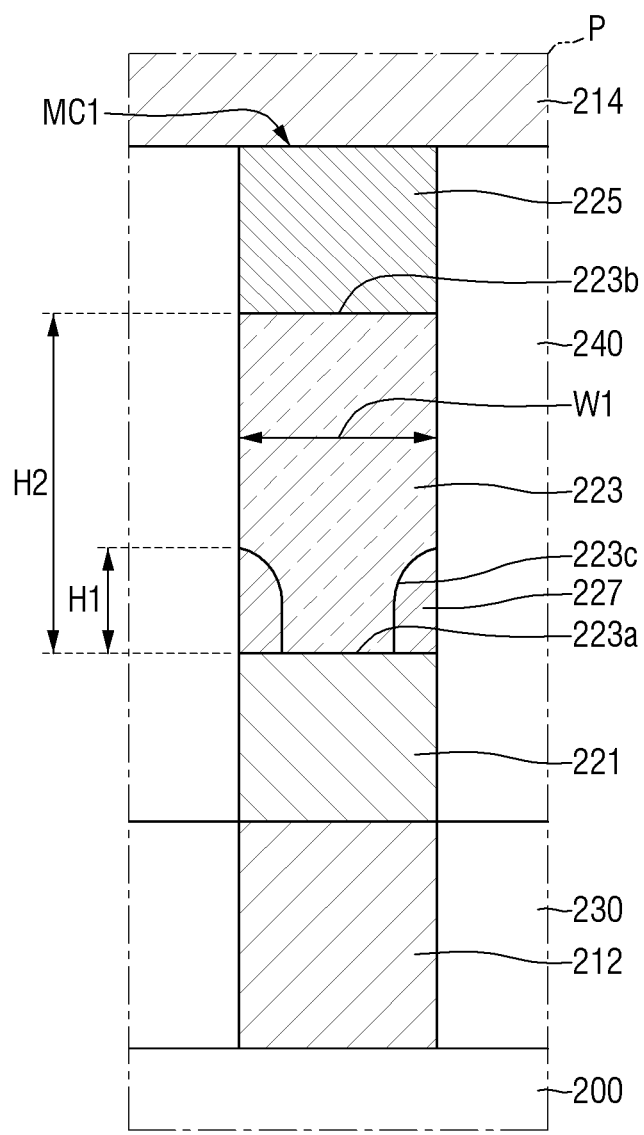

Referring to FIG. 27, the first electrode spacer film 227 may overlap the first electrode 221 in the sixth direction D6.

The first electrode spacer film 227 may be provided on the first electrode 221. The first electrode spacer film 227 may not cover the side wall of the first electrode 221 and the side wall of the first conductive line 212. The first electrode spacer film 227 may protrude from the first electrode 221 toward the second electrode 225 in the sixth direction D6.

In some example embodiments, the width of the first electrode 221 in the fourth direction D4 may be different from the width of the first OTS film 223 in the fourth direction D4 at the portion in which the first electrode 221 and the first OTS film 223 come into contact with each other. For example, the width of the first electrode 221 in the fourth direction D4 may be larger than the width of the first OTS film 223 in the fourth direction D4 at the portion in which the first electrode 221 and the first OTS film 223 come into contact with each other. However, the technical idea of the present disclosure is not limited thereto.

In some example embodiments, a first height H1 of the first electrode spacer film 227 in the sixth direction D6 is smaller than a second height H2 of the first OTS film 223 in the sixth direction D6. As an example, the ratio of the first height H1 to the second height H2 may be, but not limited to, about 0.1 to 0.35.

Figure 28:
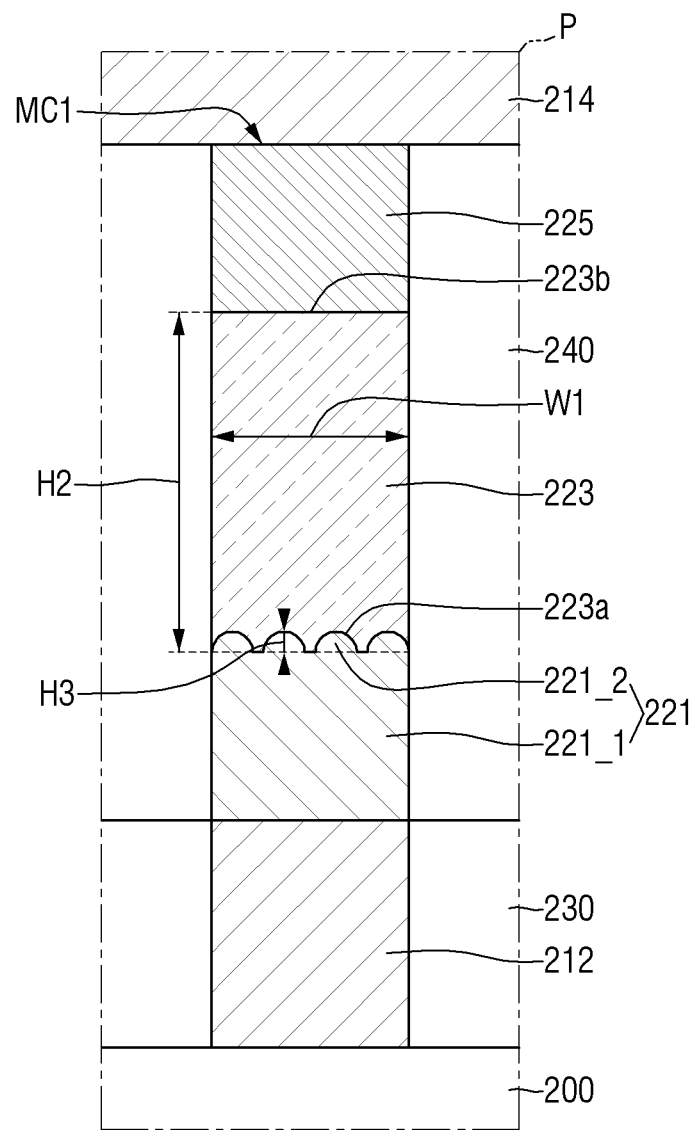

Referring to FIG. 28, the first electrode 221 may include at least three or more protrusions 221_2.

The first electrode 221 may include a body 221_1 and a protrusion 221_2. The body 221_1 may extend in the sixth direction D6. The protrusion 221_2 may be a portion that protrudes from the body 221_1 toward the second electrode 225 in the sixth direction D6.

Since the first electrode 221 includes the protrusion 221_2, the area of the portion in which the first electrode 221 and the first OTS film 223 come into contact with each other may increase. For example, the area of the second surface 223*b* on which the second electrode 225 including no protrusion and the first OTS film 223 come into contact with each other may be different from the area of the first surface 223*a* on which the first electrode 221 including the protrusion 221_2 and the first OTS film 223 come into contact with each other. The area of the first surface 223*a* is larger than the area of the second surface 223*b*. A semiconductor memory device with improved reliability can be fabricated accordingly.

In some example embodiments, the ratio of the third height H3 of the protrusion 221_2 of the first electrode 221 in the sixth direction D6 to the second height H2 of the first OTS film 223 in the sixth direction D6 may be, but not limited to, about 0.05 or more and 0.1 or less.

Figure 29:
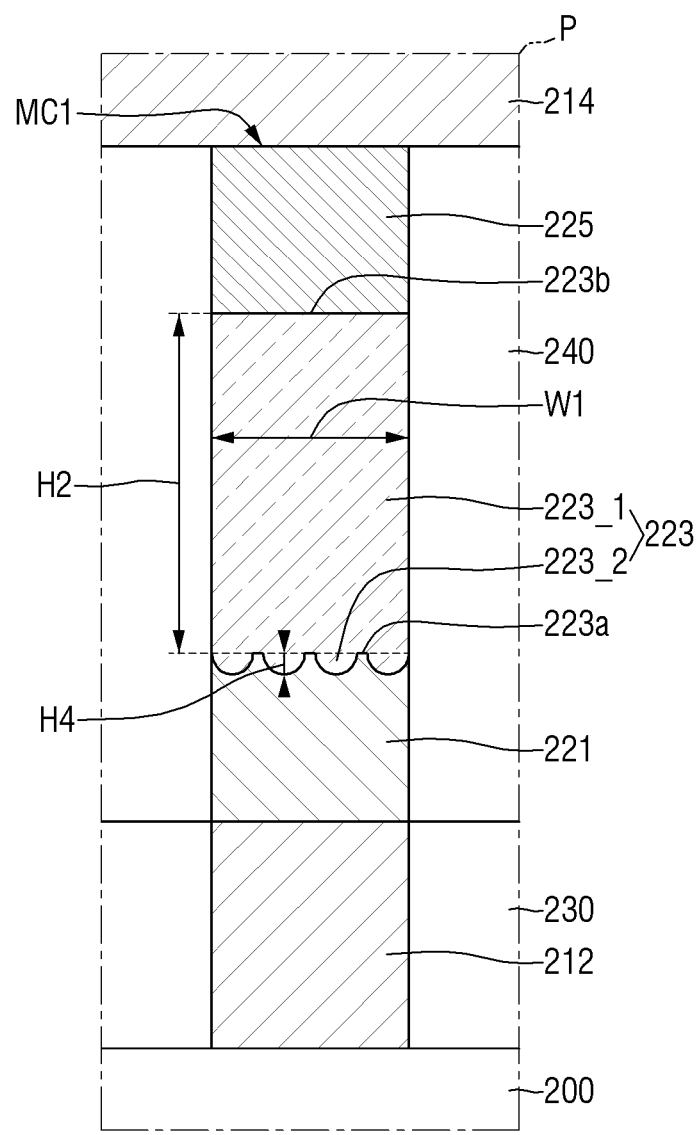

Referring to FIG. 29, the first OTS film 223 may include at least three or more protrusions 223_2.

The first OTS film 223 may include a body 223_1 and a protrusion 223_2. The body 223_1 may extend in the sixth direction D6. The protrusion 223_1 may be a portion that protrudes from the body 223_1 toward the first electrode 221 in the sixth direction D6. The protrusion 223_2 may come into contact with the first electrode 221. Since the first OTS film 223 includes the protrusion 223_2, the area of the portion in which the first electrode 221 and the first OTS film 223 come into contact with each other may increase. For example, the area of the second surface 223b on which the second electrode 225 and the first OTS film 223 come into contact with each other may be different from the area of the first surface 223a on which the first OTS film 223 including the protrusion 223_2 and the first electrode 221 come into contact with each other. The area of the first surface 223a is larger than the area of the second surface 223b. A semiconductor memory device with improved reliability can be fabricated accordingly.

In some example embodiments, the ratio of the fourth height H4 of the protrusion 223_2 of the first OTS film 223 in the sixth direction D6 to the second height H2 of the first OTS film 223 in the sixth direction D6 may be, but not limited to, about 0.05 or more and 0.1 or less.

Figure 30:
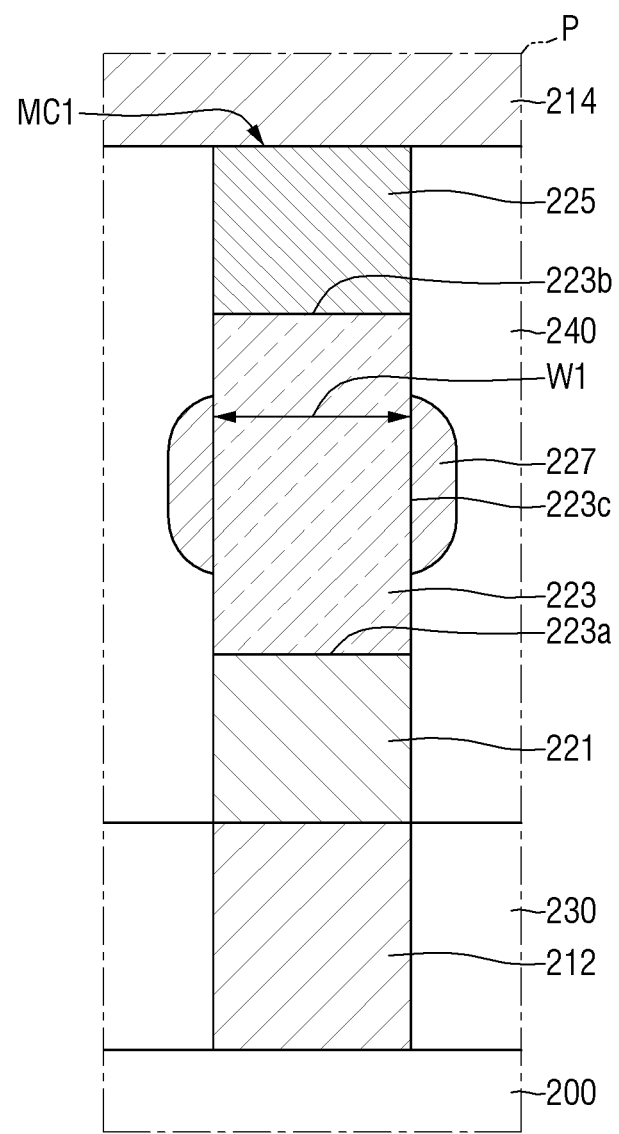

Referring to FIG. 30, the first electrode spacer film 227 is provided on the side wall of the first OTS film 223, but may not be provided on the side walls of the first electrode 221 and the first conductive line 212.

That is, the first electrode spacer film 227 may be separated from the substrate 200 in the sixth direction D6.

Figure 31:
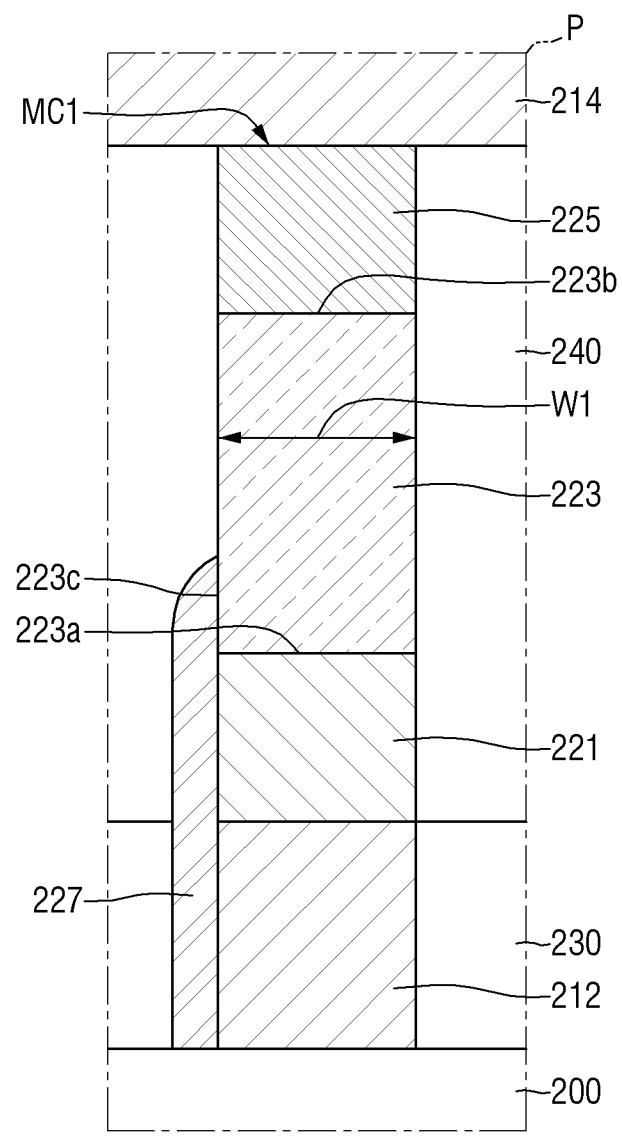

Referring to FIG. 31, the first electrode spacer film 227 may be provided only on one side wall of the first OTS film 223. The first electrode spacer film 227 may not be provided on the other side wall of the first OTS film 223.

Hereinafter, a method of fabricating a semiconductor memory device according to some example embodiments will be described referring to FIGS. 32 to 35.

FIGS. 32 to 35 are intermediate diagrams for explaining a process of fabricating the semiconductor memory device having the cross section of FIG. 22.

Figure 32:
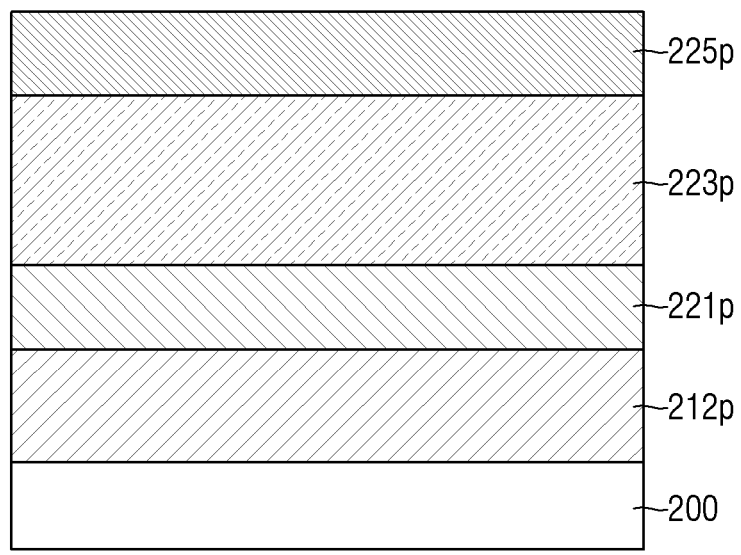
FIGS. 32 to 35 are intermediate diagrams for explaining a process of fabricating a semiconductor memory device having the cross section of FIG. 22.

First, referring to FIG. 32, the substrate 200 may be provided. A pre-first conductive line 212p, a pre-first electrode 221p, a pre-first OTS film 223p, and a pre-second electrode 225p may be sequentially stacked on the substrate 200.

The pre-first conductive line 212p may include a conductive material. For example, the pre-first conductive line 212p may include, but not limited to, at least one of tungsten (W), tungsten nitride (WN), gold (Au), silver (Ag), copper (Cu), aluminum (Al), titanium aluminum nitride (TiAlN), nickel (Ni), cobalt (Co), chromium (Cr), tin (Sn), zinc (Zn), indium tin oxide (ITO), and combinations thereof.

The pre-first electrode 221p and the pre-second electrode 225p may each include a conductive material. The pre-first electrode 221p and the pre-second electrode 225p may each include, but not limited to, carbon (C).

The pre-first OTS film 223p may include a chalcogenide material. The chalcogenide material may include a compound in which at least one of S, Te and Se as the chalcogen elements is combined with at least one of Ge, Sb, Bi, Al, Tl, Sn, Zn, As, Si, In, Ti, Ga and P.

As an example, the pre-first OTS film 223p may include at least one of GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

Figure 33:
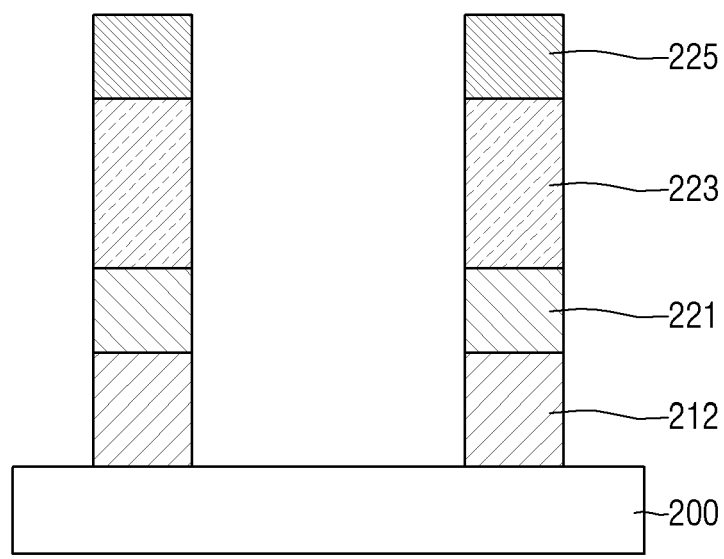

Referring to FIG. 33, the pre-first conductive line 212p, the pre-first electrode 221p, the pre-first OTS film 223p, and the pre-second electrode 225p may be patterned, respectively. Each of the pre-first conductive line 212p, the pre-first electrode 221p, the pre-first OTS film 223p, and the pre-second electrode 225p may be patterned to form the first conductive line 212, the first electrode 221, the first OTS film 223, and the second electrode 225.

Figure 34:
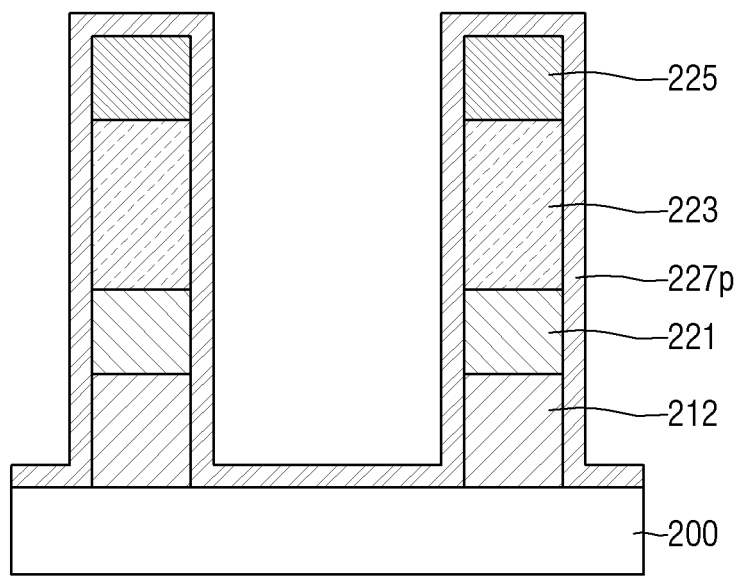

Referring to FIG. 34, a pre-first electrode spacer film 227p may be formed along the upper side of the substrate 200, the first conductive line 212, the first electrode 221, the first OTS film 223, the side wall of the second electrode 225, and the upper surface of the second electrode 225.

The pre-first electrode spacer film 227p may be formed conformally. The pre-first electrode spacer film 227p may include a conductive material. For example, the pre-first electrode spacer film 227p may include carbon (C).

Figure 35:
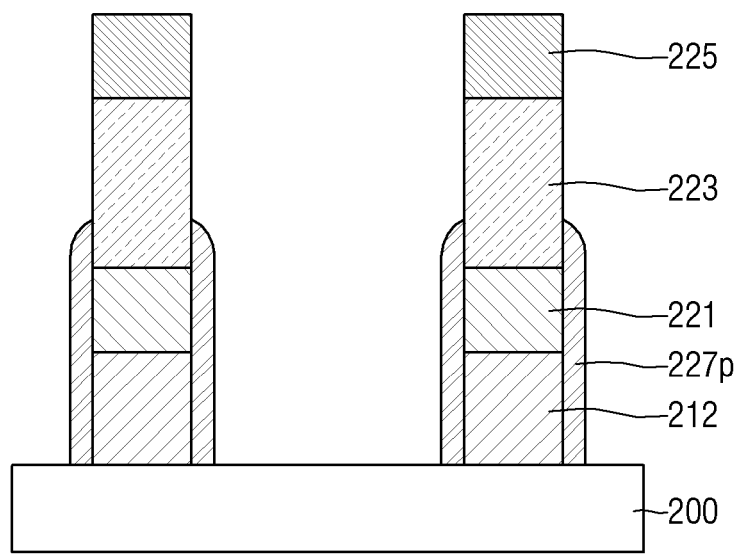

Referring to FIG. 35, the first electrode spacer film 227p may be etched to form the first electrode spacer film 227.

The first electrode spacer film 227 may cover a part of the side wall of the first OTS film 223. The first electrode spacer film 227 may cover the side walls of the first electrode 221 and the first conductive line 212.

The area of the first electrode 221 that is in contact with the first OTS film 223 can be increased through the first electrode spacer film 227.

The semiconductor memory device according to some example embodiments can be fabricated by repeating the above processes.

By way of summation and review, semiconductor memory devices may include a magnetic hard disk, a random access memory (RAM), a dynamic RAM (RAM), a synchronous dynamic RAM (SDRAM), a ferroelectric RAM (FeRAM), a magnetic RAM (MRAM), a resistive RAM (RRAM), a read only memory (ROM), a flash memory, a phase change memory (PCM), and others. The semiconductor memory device may be volatile or non-volatile. A non-volatile memory, for example, a FeRAM, may keep the stored logical state of the memory for an extended period of time even in the absence of an external power source. A volatile memory, for example, a DRAM, may lose the state stored in the semiconductor memory device over time if the volatile memory is not periodically refreshed by an external power source. Improvement in semiconductor memory device may include an increase in density of the memory cell between different measurement standards, an increase in read/write speeds, an increase in reliability, an increase in data retention, a decrease in power consumption or a decrease in fabricating costs.

Some types of the semiconductor memory devices may take advantage of variations in the polarity of the voltage applied to the cell to program and sense different logical states. For example, a self-selecting memory may improve a difference in threshold voltage of the memory cell between different programmed states. The way of programming the cells may affect the distribution of the various materials that cells make up. This may affect the ion mobility of the cell, and ultimately affect the threshold voltage of the cell. The threshold voltage may be related to the logical state of the cell. Therefore, small fluctuations between threshold voltages between different logical states may affect the accuracy with which cells may be read.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A semiconductor memory device comprising:
   a substrate;
   a first electrode on the substrate;
   a second electrode on the first electrode;
   an OTS film between the first electrode and the second electrode; and
   an electrode spacer film disposed on a part of a side wall of the OTS film,
   wherein the OTS film includes a first surface that is in contact with the first electrode, a second surface that is in contact with the second electrode, and a third surface that is in contact with the electrode spacer film, and
   a logical state of data stored in the OTS film is based on polarity of a program voltage.

2. The semiconductor memory device as claimed in claim 1, wherein the electrode spacer film covers a part of the side wall of the first electrode.

3. The semiconductor memory device as claimed in claim 1, wherein the electrode spacer film is formed of the same material as the first electrode and the second electrode.

4. The semiconductor memory device as claimed in claim 1,
   wherein a width of a portion of the OTS film is the same as a width of a portion of the first electrode, and
   wherein the portion of the OTS film and the portion of the first electrode come into contact with each other.

5. The semiconductor memory device as claimed in claim 1,
   wherein a width of a portion of the OTS film is smaller than a width of a portion of the first electrode at the portion, and
   wherein the portion of the OTS film and the portion of the first electrode come into contact with each other.

6. The semiconductor memory device as claimed in claim 1, wherein the first electrode, the OTS film, and the second electrode are sequentially aligned in a first direction, and
   a part of the OTS film protrudes toward the second electrode in the first direction.

7. The semiconductor memory device as claimed in claim 1, wherein the first surface is convex with respect to the first electrode.

8. The semiconductor memory device as claimed in claim 1, wherein the first electrode includes at least three or more protrusions that protrude toward the OTS film.

9. The semiconductor memory device as claimed in claim 8,
   wherein a ratio of a length of each protrusion of the at least three or more protrusions to a length of the OTS film is 0.05 or more and 0.1 or less.

10. A semiconductor memory device comprising:
    a substrate;
    a stacked structure having a plurality of first electrodes and a plurality of first insulating films alternately stacked on the substrate;
    a second electrode that penetrates the stacked structure in a first direction; and
    a plurality of OTS films provided between each of the plurality of first electrodes and the second electrode,
    wherein each OTS film of the plurality of OTS films includes a first surface that is in contact with a corresponding first electrode of the plurality of first electrodes, and a second surface that is in contact with the second electrode,
    a logical state of data stored in each of the plurality of OTS films is based on polarity of a program voltage, and
    the second electrode covers a part of each OTS film of the plurality of OTS films.

11. The semiconductor memory device as claimed in claim 10,
    wherein, in each OTS film of the plurality of OTS films, the first surface is convex toward the corresponding first electrode.

12. The semiconductor memory device as claimed in claim 10,
    wherein the second electrode includes a first portion that protrudes toward each first electrode of the plurality of first electrodes and overlaps a corresponding first insulating film of the plurality of first insulating films in the first direction, and a second portion that does not overlap the corresponding first insulating film in the first direction, and
    wherein, in each OTS film of the plurality of OTS films, the second surface is convex toward the corresponding first electrode.

13. The semiconductor memory device as claimed in claim 10, further comprising:
    an electrode spacer film that protrudes from the first surface of each OTS film of the plurality of OTS films in a second direction intersecting the first direction and includes the same material as the plurality of first electrodes,
    wherein the electrode spacer film overlaps each OTS film of the plurality of OTS films in the first direction.

14. The semiconductor memory device as claimed in claim 10, further comprising:
an OTS spacer film that protrudes from the second surface of each OTS film of the plurality of OTS films in a second direction intersecting the first direction and includes the same material as the plurality of OTS films,
wherein the OTS spacer film overlaps the second electrode in the first direction.

15. The semiconductor memory device as claimed in claim 10,
wherein the stacked structure includes a plurality of second insulating films, each second insulating film being provided between a corresponding first insulating film of the plurality of first insulating films and a corresponding first electrode of the plurality of first electrodes,
each first electrode of the plurality of first electrodes is provided between two adjacent second insulating films of the plurality of second insulating films, and
at least a part of each OTS film of the plurality of OTS films overlaps a corresponding second insulating film of the plurality of second insulating films in the first direction.

16. A semiconductor memory device comprising:
a substrate;
a first conductive line extending in a first direction on the substrate;
a second conductive line which extends in a second direction intersecting the first direction, on the first conductive line; and
a first memory cell provided between the first conductive line and the second conductive line,
wherein the first memory cell includes
a first electrode connected to the first conductive line,
a second electrode connected to the second conductive line,
a first OTS film between the first electrode and the second electrode, and
a first electrode spacer film that wraps at least two side walls of the first OTS film, on a part of the at least two side walls of the first OTS film,
wherein the first OTS film includes a first surface that is in contact with the first electrode, a second surface that is in contact with the second electrode, and a third surface that is in contact with the first electrode spacer film,
the first electrode spacer film includes the same material as the first electrode, and
a logical state of data stored in the first OTS film is based on polarity of a program voltage.

17. The semiconductor memory device as claimed in claim 16,
wherein the first electrode spacer film covers a part of side walls of the first electrode.

18. The semiconductor memory device as claimed in claim 16, further comprising:
a third conductive line extending in the first direction, on the second conductive line; and
a second memory cell provided between the second conductive line and the third conductive line,
wherein the second memory cell includes
a third electrode connected to the second conductive line,
a fourth electrode being in contact with the third conductive line,
a second OTS film between the third electrode and the fourth electrode, and
a second electrode spacer film that wraps at least two side walls of the second OTS film, on a part of at least two side walls of the second OTS film, and
wherein the second electrode spacer film does not overlap the first electrode spacer film in a third direction that intersects the first direction and the second direction.

19. The semiconductor memory device as claimed in claim 18,
wherein the second electrode spacer film covers a part of side walls of the second conductive line.

20. The semiconductor memory device as claimed in claim 16, wherein a width of the first OTS film gradually decreases from the first conductive line toward the second conductive line.

* * * * *